(12) United States Patent
Yoon et al.

(10) Patent No.: US 8,980,526 B2
(45) Date of Patent: Mar. 17, 2015

(54) HYDROPHILIC PHOTOACID GENERATOR AND RESIST COMPOSITION COMPRISING SAME

(71) Applicant: Korea Kumho Petrochemical Co., Ltd., Seoul (KR)

(72) Inventors: Dae Kyung Yoon, Asan-si (KR); Kyoung Jin Ryu, Asan-si (KR); Sung Jae Lee, Asan-si (KR); Hyun Sang Joo, Daejon (KR)

(73) Assignee: Korea Kumho Petrochemical Co., Ltd., Seoul (KR)

( * ) Notice: Subject to any disclaimer, the term of this patent is extended or adjusted under 35 U.S.C. 154(b) by 120 days.

(21) Appl. No.: 13/713,961

(22) Filed: Dec. 13, 2012

(65) Prior Publication Data

US 2013/0177852 A1   Jul. 11, 2013

(30) Foreign Application Priority Data

Dec. 28, 2011 (KR) ........................ 10-2011-0145245

(51) Int. Cl.
*G03F 7/004* (2006.01)
*C07C 381/12* (2006.01)
*G03F 7/031* (2006.01)
*G03F 7/039* (2006.01)

(52) U.S. Cl.
CPC .............. *G03F 7/031* (2013.01); *G03F 7/0045* (2013.01); *G03F 7/0395* (2013.01); *G03F 7/0397* (2013.01); *Y10S 430/114* (2013.01); *Y10S 430/115* (2013.01)
USPC ........ 430/270.1; 430/913; 430/914; 526/243; 526/245; 526/287

(58) Field of Classification Search
USPC ...................................... 430/270.1, 913, 914
See application file for complete search history.

(56) References Cited

U.S. PATENT DOCUMENTS

| | | | |
|---|---|---|---|
| 7,459,261 B2* | 12/2008 | Hatakeyama et al. | 430/270.1 |
| 8,039,198 B2* | 10/2011 | Tachibana et al. | 430/270.1 |
| 8,440,385 B2* | 5/2013 | Hirano et al. | 430/270.1 |
| 2006/0147836 A1 | 7/2006 | Hatakeyama et al. | |
| 2009/0234155 A1* | 9/2009 | Oh et al. | 562/100 |
| 2010/0028804 A1* | 2/2010 | Iwato et al. | 430/270.1 |
| 2010/0075256 A1* | 3/2010 | Joo et al. | 430/286.1 |
| 2010/0099042 A1* | 4/2010 | Ohashi et al. | 430/270.1 |
| 2011/0189607 A1* | 8/2011 | Ohashi et al. | 430/270.1 |
| 2012/0135350 A1* | 5/2012 | Kobayashi et al. | 430/285.1 |
| 2013/0029270 A1* | 1/2013 | Hatakeyama | 430/284.1 |
| 2013/0209937 A1* | 8/2013 | Takihana et al. | 430/285.1 |
| 2013/0224660 A1* | 8/2013 | Ohashi et al. | 430/285.1 |
| 2014/0141377 A1* | 5/2014 | Hatakeyama | 430/296 |

FOREIGN PATENT DOCUMENTS

| | | |
|---|---|---|
| JP | 2006/045311 | 2/2006 |
| JP | 2006/178317 | 7/2006 |

(Continued)

OTHER PUBLICATIONS

Singapore Search Report issued in Patent Application No. 2012086823 on Aug. 12, 2014.

(Continued)

*Primary Examiner* — Amanda C. Walke
(74) *Attorney, Agent, or Firm* — Birch, Stewart, Kolasch & Birch, LLP

(57) ABSTRACT

Disclosed are a hydrophilic photoacid generator prepared by copolymerization of a first (meth)acrylic acid ester having a structure represented by the following Formula 1 or 2, with a polymerizable monomer selected from the group consisting of a second (meth)acrylic acid ester, an olefin-based compound and a mixture thereof, each of which contains a functional group selected from the group consisting of a hydroxyl group, a carboxyl group, a lactone group, a nitrile group and a halogen group:

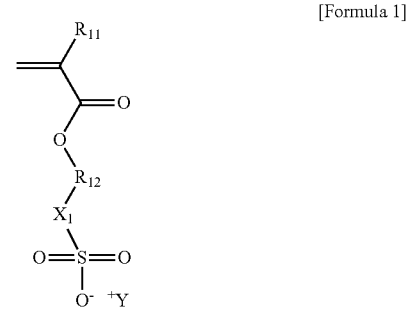

[Formula 1]

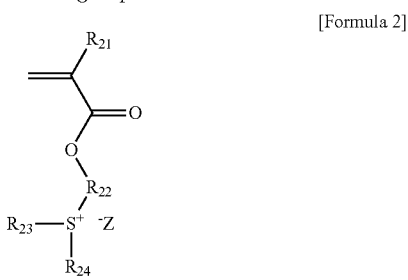

[Formula 2]

wherein respective substituents are defined in the specification, and a resist composition comprising the same. The hydrophilic photoacid generator is uniformly dispersed in a resist film, thus improving a line edge roughness of resist patterns.

4 Claims, No Drawings

(56) References Cited

FOREIGN PATENT DOCUMENTS

| | | |
|---|---|---|
| JP | 2009-093137 | 4/2009 |
| TW | 201142513 A1 | 12/2011 |

OTHER PUBLICATIONS

Taiwanese Search Report issued in Taiwanese Patent Application No. 101149859 on Jun. 3, 2014.

\* cited by examiner

HYDROPHILIC PHOTOACID GENERATOR AND RESIST COMPOSITION COMPRISING SAME

BACKGROUND OF THE INVENTION

1. Field of the Invention

The present invention relates to a novel hydrophilic photoacid generator which is uniformly dispersed in a resist film and thus improves a line edge roughness of resist patterns, and a resist composition comprising the same.

2. Description of the Related Art

A chemically amplified positive resist composition used for semiconductor microfabrication including a lithographic process contains a photoacid generator containing a compound that generates an acid when light is irradiated thereto.

The photoacid generator absorbs light used for semiconductor patterning processes. Regarding an onium salt generally used as the photoacid generator, a cationic moiety of the onium salt is degraded into a radical form and is present as a different molecular form and an acid is produced at an anionic moiety and the acid diffuses into a resist film during wafer baking after light irradiation.

In such a process, a photoacid generator directly affects resolution and line edge roughness of resists due to various factors such as light-absorbing capacity, acid generation efficiency caused by light absorbance, diffusion capacity of acid generated from anions, and strength of anionic acid.

Also, in order to obtain superior evenness, photoacid generators used for chemically-amplified resist materials should be uniformly dispersed in a resist composition. Accordingly, solubility of photoacid generator in a resist solvent and miscibility thereof with a resin are considerably important. However, conventional photoacid generators do not have superior solubility in resist solvents and excellent miscibility with resin resists, and are difficult to prepare at a low cost.

RELATED ART

Patent Document (Patent Document 1) Korean Patent Laid-open No. 2007-0071121 (published on Jul. 4, 2007)
(Patent Document 2) Korean Patent No. 0669183 (registered on Jan. 9, 2007)
(Patent Document 3) Korean Patent No. 0829615 (registered on May 7, 2008)

SUMMARY OF THE INVENTION

It is one aspect of the present invention to provide a hydrophilic photoacid generator that is uniformly dispersed in a resist film, thus improving characteristics such as line edge roughness of resist patterns.

It is another aspect of the present invention to provide a resist composition comprising the hydrophilic photoacid generator.

In accordance with one aspect of the present invention, provided is a hydrophilic photoacid generator prepared by copolymerization of a first (meth)acrylic acid ester having a structure represented by the following Formula 1 or 2, with a polymerizable monomer selected from the group consisting of a second (meth)acrylic acid ester, an olefin-based compound and a mixture thereof, each of which contains a functional group selected from the group consisting of a hydroxyl group, a carboxyl group, a lactone group, a nitrile group and a halogen group:

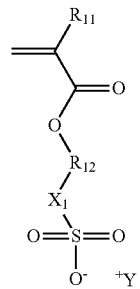

[Formula 1]

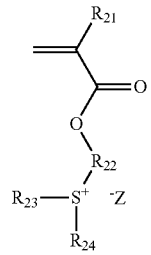

[Formula 2]

wherein $R_{11}$ and $R_{21}$ are each independently selected from the group consisting of a hydrogen atom, a C1 to C4 alkyl group and a C1 to C4 alkoxy group;

$R_{12}$ and $R_{22}$ are each independently selected from the group consisting of a C1 to C20 alkanediyl group, a C2 to C20 alkenediyl group, a C1 to C20 heteroalkanediyl group, a C2 to C20 heteroalkenediyl group, a C3 to C30 cycloalkanediyl group, a C3 to C30 cycloalkenediyl group, a C2 to C30 heterocycloalkanediyl group and a C3 to C30 heterocycloalkenediyl group;

$R_{23}$ and $R_{24}$ are each independently selected from the group consisting of a hydrogen atom, a C1 to C20 alkyl group, a C1 to C20 alkenyl group, a C3 to C30 cycloalkyl group, a C3 to C30 cycloalkenyl group, a C6 to C30 aryl group and a C2 to C30 heterocyclic group, or $R_{23}$ and $R_{24}$ are bonded to each other to form a C3 to C30 saturated or unsaturated hydrocarbon ring;

$X_1$ is selected from the group consisting of: a C1 to C20 alkanediyl group containing a functional group selected from the group consisting of a halogen group, a C1 to C5 haloalkyl group and a cyano group; a C6 to C30 arylene group; and a C5 to C30 heteroarylene group;

$Y^+$ is a compound represented by the following Formula 3:

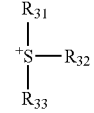

[Formula 3]

wherein $R_{31}$, $R_{32}$ and $R_{33}$ are each independently selected from the group consisting of a C1 to C20 alkyl group, a C2 to C20 alkenyl group, a C3 to C30 cycloalkyl group, a C3 to C30 cycloalkenyl group and a C6 to C30 aryl group, wherein one or more hydrogen atoms of $R_{31}$, $R_{32}$ and $R_{33}$ are each independently substituted by any substituent selected from the group consisting of a halogen group, a hydroxyl group, a carboxyl group, a thio group, a C1 to C10 alkyl group, a C1 to C10 alkoxy group, a C6 to C18 aryl group, a (C1 to C10 alkyl)thio group, a C6 to C18 aryloxy group, a (meth)acryloyloxy group, a (C1 to C10 alkyl)carbonyloxy group and a combination thereof; and $Z^-$ is a compound represented by the following Formula 4:

[Formula 4]

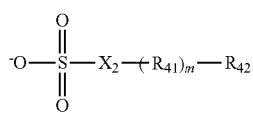

wherein $R_{41}$ is selected from the group consisting of a C1 to C20 alkanediyl group, a C2 to C20 alkenediyl group, a C1 to C20 heteroalkanediyl group, a C2 to C20 heteroalkenediyl group, a C3 to C30 cycloalkanediyl group, a C3 to C30 cycloalkenediyl group, a C2 to C30 heterocycloalkanediyl group and a C3 to C30 heterocycloalkenediyl group;

$R_{42}$ is selected from the group consisting of a hydrogen atom, a halogen atom, a C1 to C20 alkyl group, a C2 to C20 alkenyl group, a C1 to C20 alkoxy group, a C1 to C20 alkoxyalkyl group, a C1 to C20 haloalkyl group, a C1 to C20 haloalkoxy group, a C1 to C20 alkylthio group, a C3 to C30 cycloalkyl group, a C3 to C30 cycloalkenyl group, a C6 to C30 aryl group, a C7 to C30 aralkyl group, a C5 to C30 heterocyclic group and

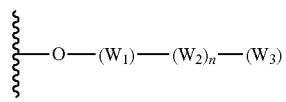

(wherein $W_1$ is —(C=O)— or —(SO$_2$)—; $W_2$ is a C1 to C10 alkanediyl group or a C1 to C10 heteroalkanediyl group; and $W_3$ is selected from the group consisting of a hydrogen atom, a halogen group, a C1 to C10 alkyl group, a C2 to C20 alkenyl group, a C1 to C10 alkoxy group, a C1 to C10 haloalkyl group, a (C1 to C10 alkyl)thio group, a C3 to C30 cycloalkyl group, a C6 to C30 aryl group, a (C6 to C30 aryl)oxy group, a (C6 to C30 aryl)thio group, a C5 to C30 heterocyclic group and a combination thereof);

$X_2$ is a C1 to C20 haloalkanediyl group in which at least one hydrogen atom is substituted by a halogen group; and m and n are each independently 0 or 1.

In Formula 1, $R_{11}$ is a hydrogen atom or a C1 to C4 alkyl group; $R_{12}$ is selected from the group consisting of a C1 to C10 alkanediyl group, C2 to C10 alkenediyl group, a C1 to C10 heteroalkanediyl group, a C2 to C10 heteroalkenediyl group, a C3 to C18 cycloalkanediyl group, a C3 to C18 cycloalkenediyl group, a C2 to C18 heterocycloalkanediyl group and a C3 to C18 heterocycloalkenediyl; and $X_1$ is selected from the group consisting of: a C1 to C10 alkanediyl group containing a functional group selected from the group consisting of a fluoro group, a perfluoroalkyl group and a cyano group; a C6 to C18 arylene group; and a heteroarylene group.

Preferably, in Formula 1, $X_1$ is selected from the group consisting of a difluoromethylene group, a cyanomethylene group and a benzenediyl group.

In Formula 1, $Y^+$ is the compound represented by Formula 3 above, wherein, in Formula 3, $R_{31}$, $R_{32}$ and $R_{33}$ are each independently selected from the group consisting of a C1 to C10 alkyl group, a C1 to C10 alkenyl group, a C3 to C14 monocyclic cycloalkyl group, a C8 to C18 bicyclic cycloalkyl group, a C10 to C30 tricyclic cycloalkyl group, a C10 to C30 tetracyclic cycloalkyl group, a C3 to C18 cycloalkenyl group and a C6 to C18 aryl group, wherein one or more hydrogen atoms of $R_{31}$, $R_{32}$ and $R_{33}$ are each independently substituted by any substituent selected from the group consisting of a halogen group, a hydroxyl group, a carboxyl group, a thio group, a C1 to C10 alkyl group, a C1 to C10 alkoxy group, a C6 to C18 aryl group, a (C1 to C10 alkyl)thio group, a C6 to C18 aryloxy group, a (meth)acryloyloxy group, a (C1 to C10 alkyl)carbonyloxy group and a combination thereof.

Preferably, in Formula 1, $Y^+$ has a structure represented by one of the following Formulae 6a to 6r:

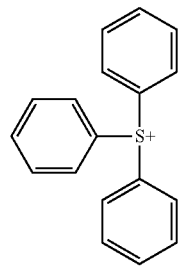

(6a)

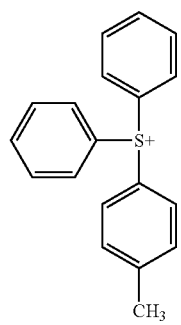

(6b)

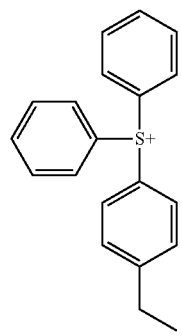

(6c)

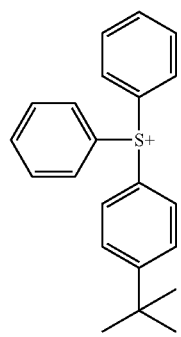

(6d)

(6e)
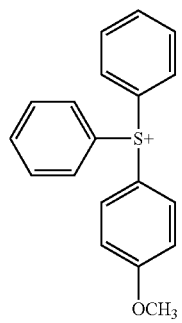
(6f)
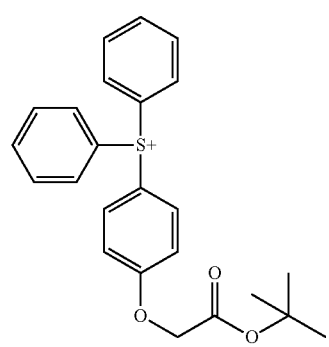
(6g)
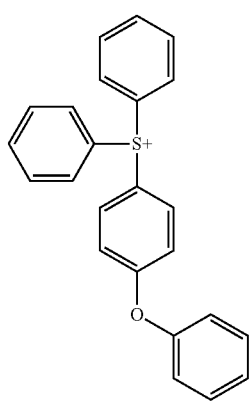
(6h)
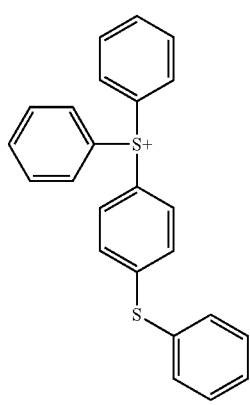
(6i)
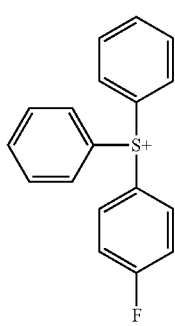
(6j)
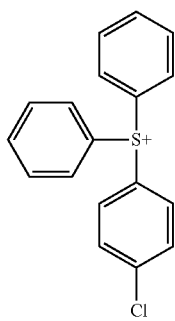
(6k)
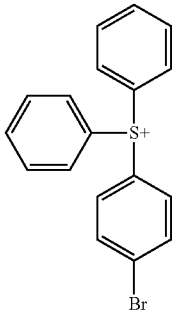
(6l)
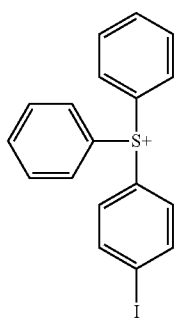
(6m)
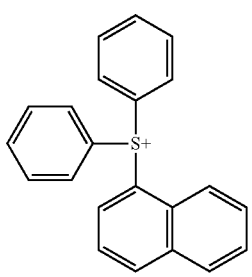

-continued

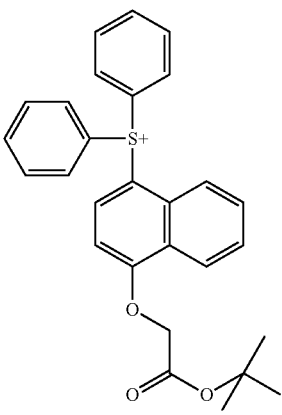
(6n)

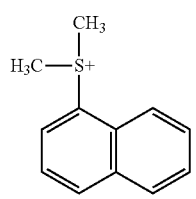
(6o)

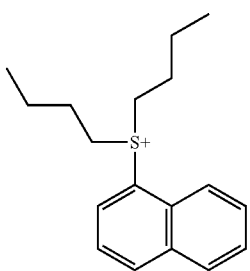
(6p)

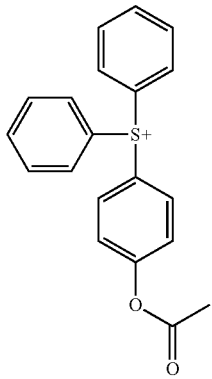
(6q)

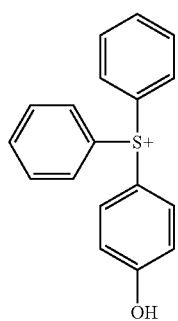
(6r)

In Formula 2, $R_{21}$ is a hydrogen atom or a C1 to C4 alkyl group; $R_{22}$ is selected from the group consisting of a C1 to C10 alkanediyl group, C2 to C10 alkenediyl group, a C1 to C10 heteroalkanediyl group, a C2 to C10 heteroalkenediyl group, a C3 to C18 cycloalkanediyl group, a C3 to C18 cycloalkenediyl group, a C2 to C18 heterocycloalkanediyl group and a C3 to C18 heterocycloalkenediyl; and $R_{23}$ and $R_{24}$ are each independently selected from the group consisting of a C1 to C10 alkyl group, a C1 to C10 alkenyl group, a C3 to C14 monocyclic cycloalkyl group, a C8 to C18 bicyclic cycloalkyl group, a C10 to C30 tricyclic cycloalkyl group, a C10 to C30 tetracyclic cycloalkyl group, a C3 to C18 cycloalkenyl group, a C6 to 18 aryl group and a C5 to C18 heterocyclic group.

Preferably, in Formula 2, $R_{23}$ and $R_{24}$ are each independently selected from the group consisting of a C1 to C4 alkyl group, a C2 to C4 alkenyl group, and compounds represented by Formulae 5a to 5u:

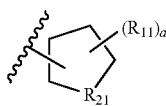
(5a)

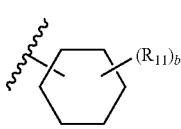
(5b)

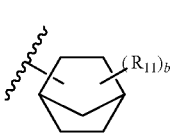
(5c)

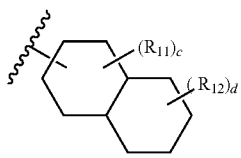
(5d)

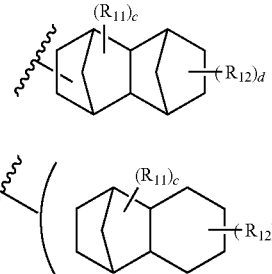
(5e)

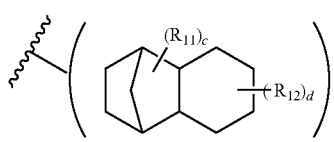
(5f)

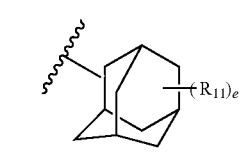
(5g)

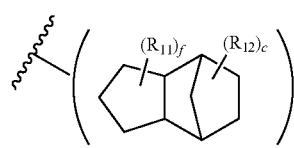
(5h)

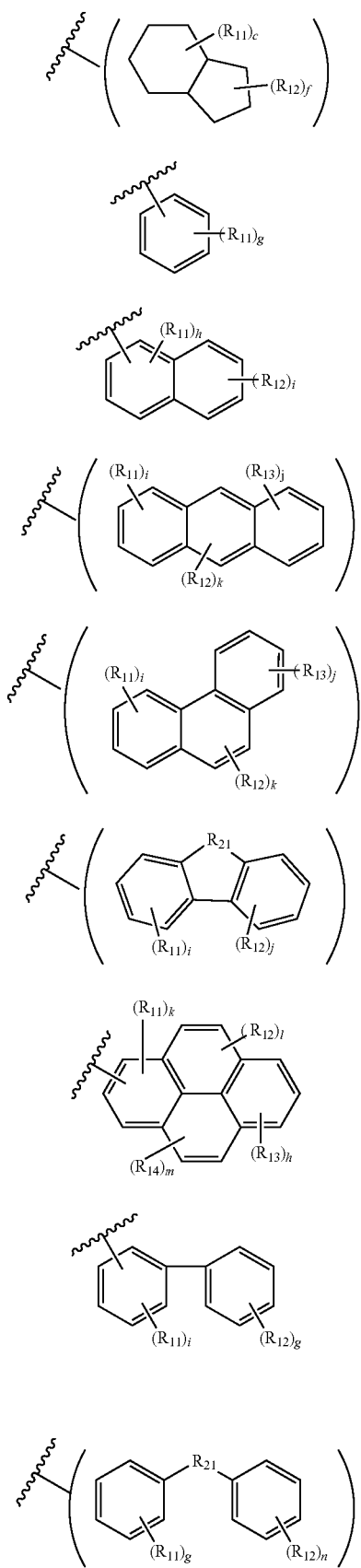
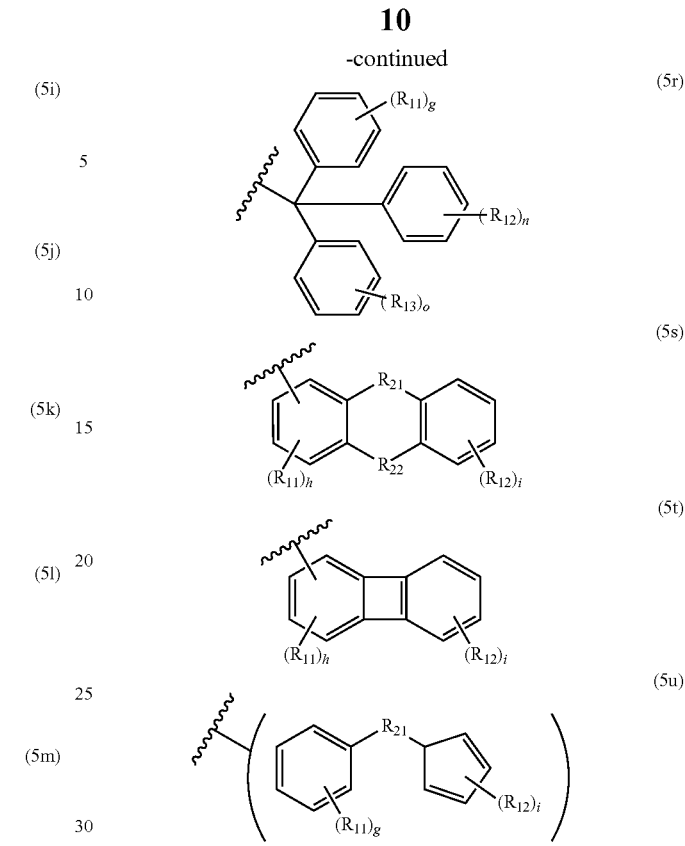

wherein, in Formulae 5a to 5u, $R_{11}$, $R_{12}$, $R_{13}$ and $R_{14}$ are each independently selected from the group consisting of a halogen atom, an alkyl group, a perfluoroalkyl group, a perfluoroalkoxy group, a hydroxyl group, a carboxyl group, a cyano group, a nitrile group, a nitro group, an amino group, a thio group, an alkylthio group, an aldehyde group, a cycloalkyl group, a heterocyclic group, an allyl group, an aryl group, $OR_a$, $COR_a$ and $COOR_a$, wherein $R_a$ is an alkyl group or an aryl group; $R_{21}$ and $R_{22}$ are each independently selected from the group consisting of $CR_bR_c$, O, CO, S and $NR_d$, wherein $R_b$ to $R_d$ are each independently selected from the group consisting of a hydrogen atom, an alkyl group and an aryl group; and a and f are an integer of 0 to 7; b is an integer of 0 to 11; c and d are each independently an integer of 0 to 9; e is an integer of 0 to 15; g, n, q, r and s are each independently an integer of 0 to 5; h, i and j are each independently an integer of 0 to 3; k, l and m are each independently an integer of 0 to 2; and o and p are an integer of 0 to 4, with the proviso of $0 \leq c+d \leq 17$, $0 \leq c+f \leq 15$, $0 \leq i+j+k \leq 9$, $0 \leq h+i \leq 7$, $0 \leq o+p \leq 9$, and $0 \leq h+o \leq 8$.

In Formula 2, $Z^-$ is the compound represented by Formula 4, wherein, in Formula 4, $R_{41}$ is selected from the group consisting of a C1 to C10 alkanediyl group, a C2 to C10 alkenediyl group, a C1 to C10 heteroalkanediyl group, a C2 to C10 heteroalkenediyl group, a C3 to C14 monocyclic cycloalkanediyl group, a C8 to C18 bicyclic cycloalkanediyl group, a C10 to C30 tricyclic cycloalkanediyl group, a C10 to C30 tetracyclic cycloalkanediyl group, a C3 to C18 cycloalkenediyl group, a C2 to C18 heterocycloalkanediyl group and a C3 to C18 heterocycloalkenediyl group; $R_{42}$ is selected from the group consisting of a hydrogen atom, a halogen atom, a C1 to C10 alkyl group, a C2 to C10 alkenyl group, a C1 to C10 alkoxy group, a C2 to C10 alkoxyalkyl group, a C1 to C10 haloalkyl group, a C1 to C10 haloalkoxy group, a C1 to C10 alkylthio group, a C3 to C14 monocyclic cycloalkyl group, a C8 to C18 bicyclic cycloalkyl group, a C10 to C30 tricyclic cycloalkyl group, a C10 to C30 tetracyclic cycloalkyl group, a C3 to C18 cycloalkenyl group, a C6 to C18 aryl group, a C7 to C18 aralkyl group and

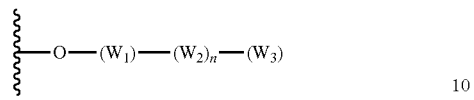

(wherein $W_1$ is —(C=O)— or —(SO_2)—; $W_2$ is a C1 to C5 alkanediyl group or a C1 to C5 heteroalkanediyl group; and $W_3$ is a hydrogen atom, a halogen group, a C1 to C5 alkyl group, a C2 to C10 alkenyl group, a C1 to C5 alkoxy group, a C1 to C5 haloalkyl group, a (C1 to C5 alkyl)thio group, a C3 to C5 cycloalkyl group, a C6 to C18 aryl group, a (C6 to C18 aryl)oxy group, a (C6 to C18 aryl)thio group, a C5 to C18 heterocyclic group and a combination thereof); and $X_2$ is a C1 to C10 fluoroalkanediyl group in which at least one hydrogen atom is substituted by a fluoro group.

In Formula 2, $Z^-$ is selected from the group consisting of functional groups represented by Formulae 7a to 7n and 8a to 8x:

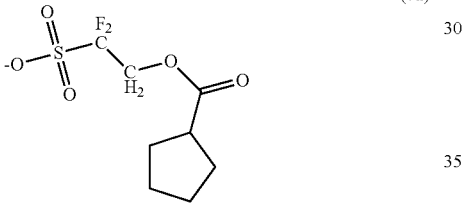
(7a)

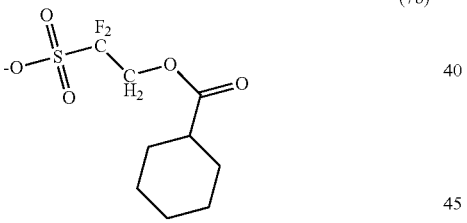
(7b)

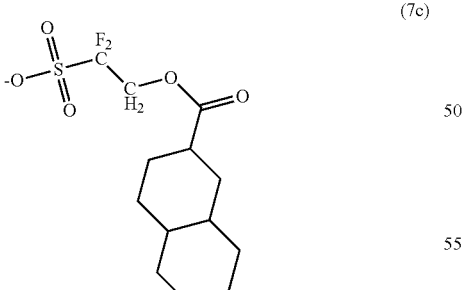
(7c)

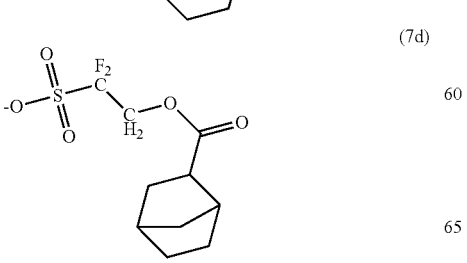
(7d)

-continued

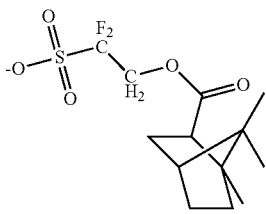
(7e)

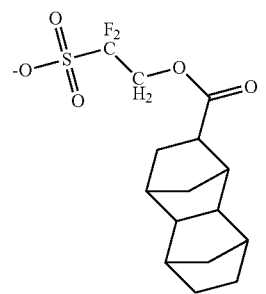
(7f)

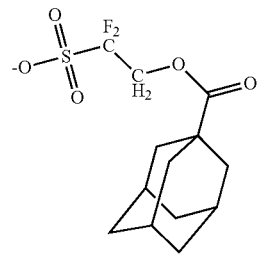
(7g)

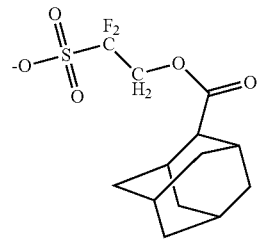
(7h)

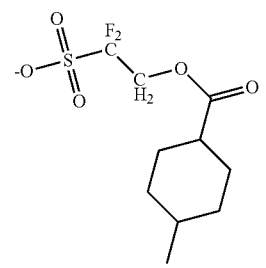
(7i)

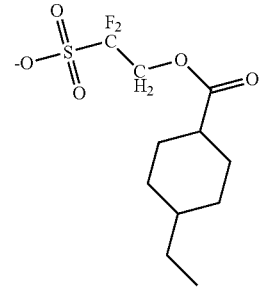
(7j)

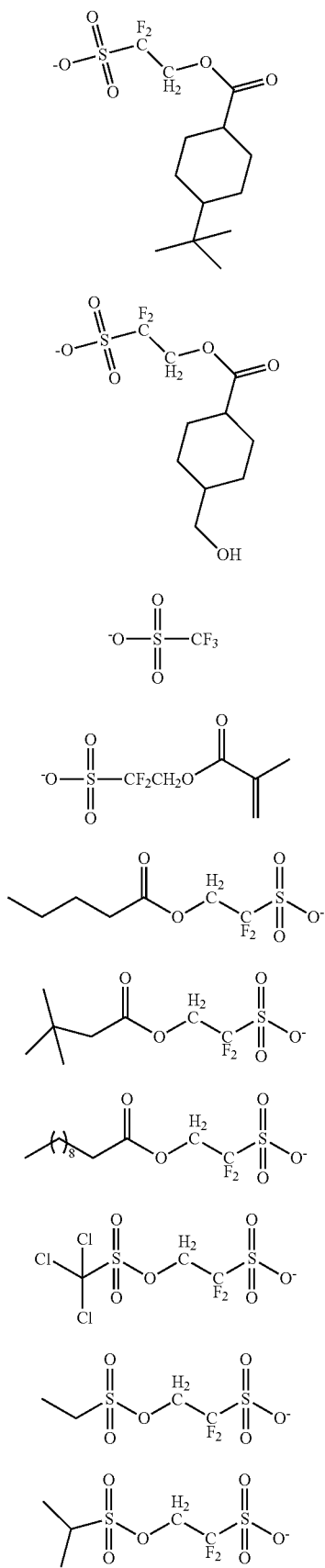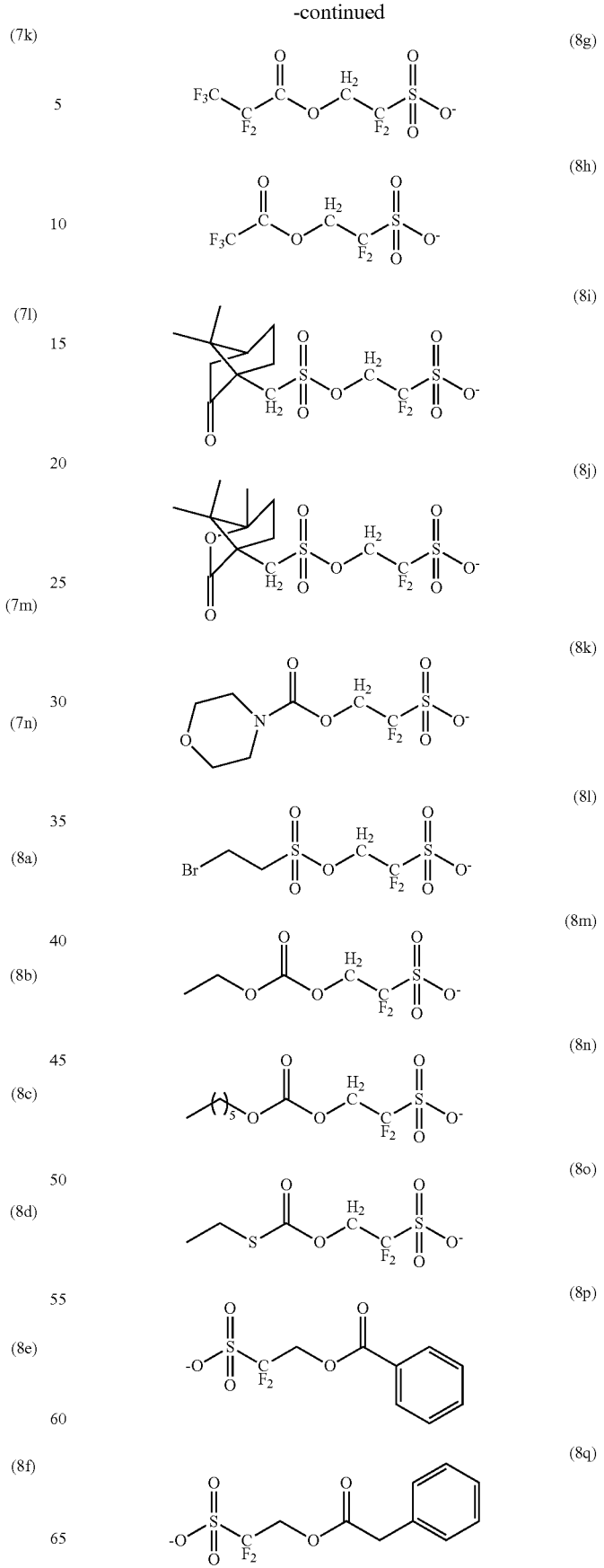

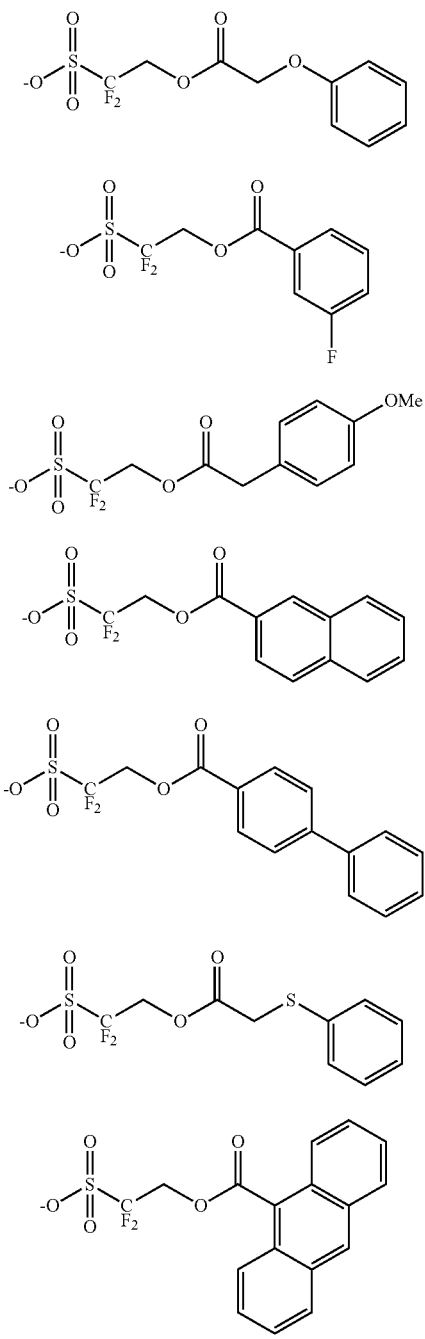

The second (meth)acrylic acid ester is a copolymer represented by the following Formula 9:

[Formula 9]

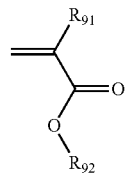

wherein $R_{91}$ is selected from the group consisting of a hydrogen atom, a C1 to C4 alkyl group, and a C1 to C4 alkoxy group; and $R_{92}$ is a hydrogen atom or is selected from the group consisting of a C1 to C20 alkyl group, a C2 to C20 alkenyl group, a C3 to C30 cycloalkyl group, a C3 to C30 cycloalkenyl group, a C6 to C30 aryl group, a C2 to C30 heterocyclic group and a combination thereof, each of which contains a functional group selected from the group consisting of a hydroxyl group, a carboxyl group, a lactone group, a nitrile group and a halogen group.

In Formula 9, $R_{92}$ is a hydrogen atom, or is selected from the group consisting of a C1 to C10 alkyl group, a C2 to C10 alkenyl group, a C3 to C14 monocyclic cycloalkyl group, a C8 to C18 bicyclic cycloalkyl group, a C10 to C30 tricyclic cycloalkyl group, a C10 to C30 tetracyclic cycloalkyl group, a C3 to C18 cycloalkenyl group, a C6 to C18 aryl group, a C7 to C18 aralkyl group and a C2 to C18 heterocyclic group, each of which contains a functional group selected from the group consisting of a hydroxyl group, a carboxyl group, a lactone group, a nitrile group and a halogen group.

Preferably, in Formula 9, $R_{92}$ is selected from the group consisting of a hydroxymethyl group, a hydroxyethyl group, a hydroxypropyl group, and compounds represented by Formulae 10-1 to 10-30:

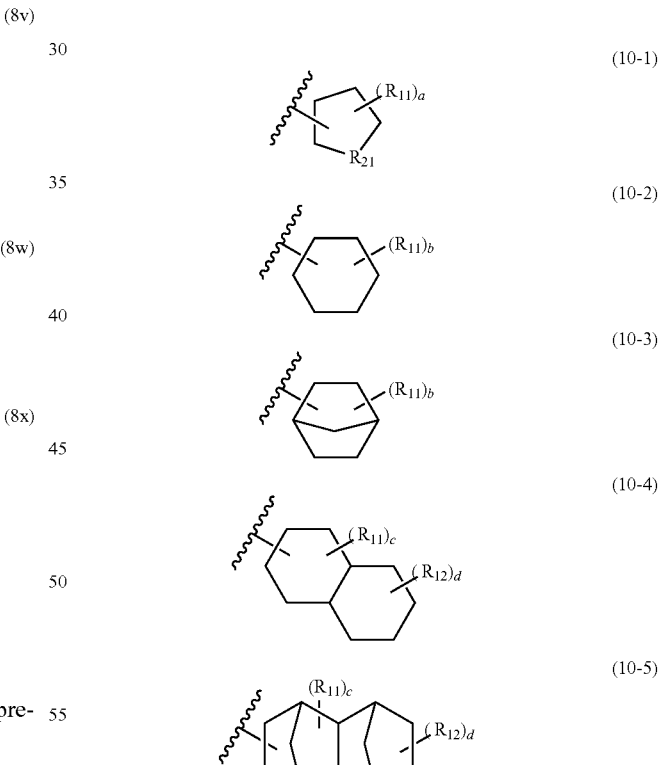

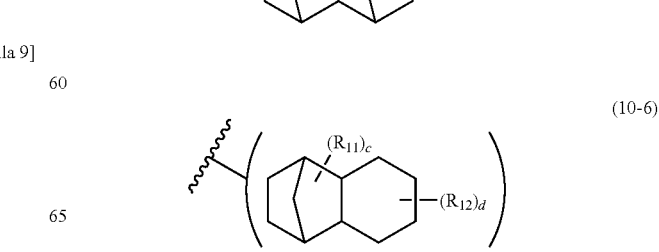

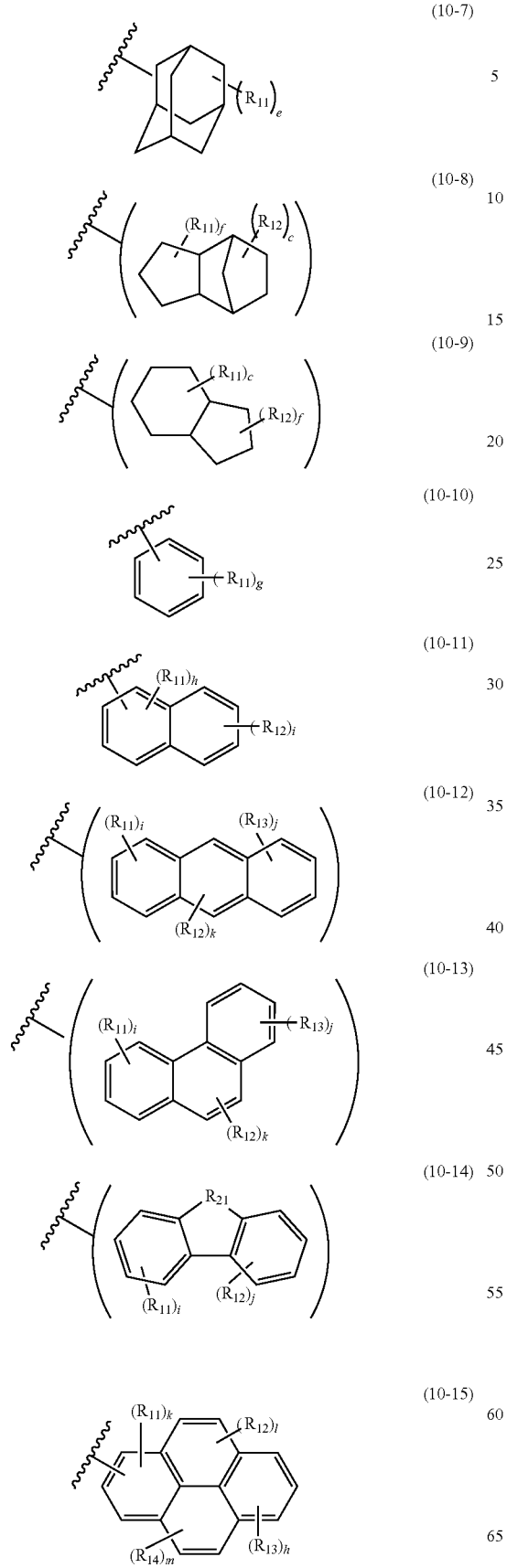
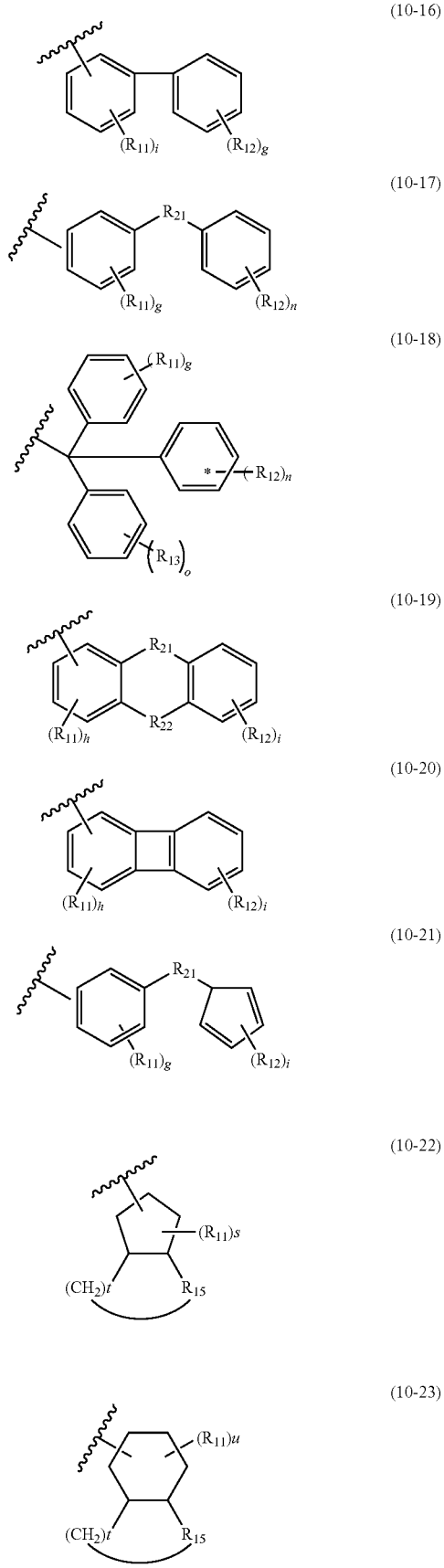

-continued (10-24) 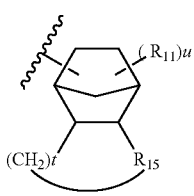

(10-25) 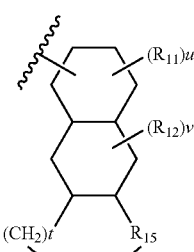

(10-26) 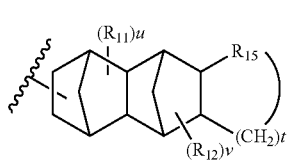

(10-27) 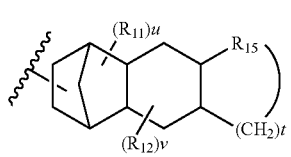

(10-28) 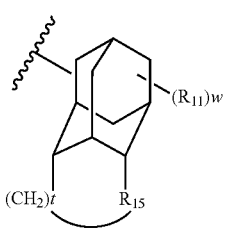

(10-29) 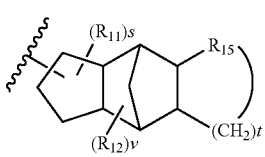

(10-30) 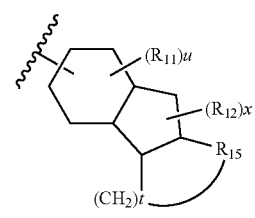

wherein, in Formulae 10-1 to 10-30, $R_{11}$, $R_{12}$, $R_{13}$, and $R_{14}$ are each independently a hydroxyl group or a carboxyl group; $R_{15}$ is a C1 to C3 heteroalkanediyl group containing a carbonyl group which is bonded to a neighboring group to form a lactone group; $R_{21}$ and $R_{22}$ are each independently selected from the group consisting of $CR_aR_b$, O, CO, S and $NR_c$, wherein $R_a$ to $R_c$ are each independently selected from the group consisting of a hydrogen atom, a C1 to C5 alkyl group and a C6 to C18 aryl group; and a and f are an integer of 0 to 7, b is an integer of 0 to 11; c and d are each independently an integer of 0 to 9; e is an integer of 0 to 15; g, n, q, r and s are each independently an integer of 0 to 5; h, i and j are each independently an integer of 0 to 3; k, l, m and x are each independently an integer of 0 to 2; o, p and v are each independently an integer of 0 to 4; t is an integer of 1 or 2; u is an integer of 0 to 7; and w is an integer of 0 to 13, with the proviso of $0 \leq c+d \leq 17$, $0 \leq c+f \leq 15$, $0 \leq i+j+k \leq 9$, $0 \leq h+i \leq 7$, $0 \leq o+p \leq 9$, and $0 \leq h+o \leq 8$.

The polymerizable monomer is selected from the group consisting of cyclic olefin, vinyl, styrene and a derivative thereof, each of which contains a functional group consisting of a hydroxyl group, a carboxyl group, a lactone group, a nitro group and a halogen group.

The polymerizable monomer is represented by the following Formula 11:

[Formula 11]

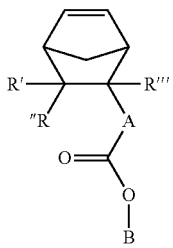

wherein R', R" and R'" are each independently a hydrogen atom or a C1 to C8 alkyl group;

A is selected from the group consisting of a C1 to C20 alkanediyl group, a C2 to C20 alkenediyl group, a C3 to C30 cycloalkanediyl group, a C3 to C30 cycloalkenediyl group, a C1 to C20 heteroalkanediyl group, a C2 to C20 heteroalkenediyl group, a C2 to C30 heterocyclic group and a combination thereof, each of which contains a functional group selected from the group consisting of a hydroxyl group, a carboxyl group, a lactone group, a nitro group and a halogen group; and B is selected from the group consisting of a C1 to C20 alkyl group, a C1 to C20 alkenyl group, a C3 to C30 cycloalkyl group, a C3 to C30 cycloalkenyl group, a C6 to C30 aryl group, a C1 to C20 heteroalkyl group, a C2 to C30 heterocyclic group and a combination thereof.

In Formula 11, A is selected from the group consisting of a C1 to C10 alkanediyl group, a C2 to C10 alkenediyl group, a C3 to C14 monocyclic cycloalkanediyl group, a C8 to C18 bicyclic cycloalkanediyl group, a C10 to C30 tricyclic cycloalkanediyl group, a C10 to C30 tetracyclic cycloalkanediyl group, a C6 to C18 cycloalkenediyl group, a C1 to C10 heteroalkanediyl group, a C2 to C10 heteroalkenediyl group, a C5 to C18 heterocyclic group and a combination thereof, each of which contains a hydroxyl group.

Preferably, in Formula 11, A is selected from the group consisting of —OCH(OH)—, —COCH(OH)—, —COCH$_2$CH(OH)—, —CH(OH)—, —CH(OH)CH$_2$—, —CH(OH)—O—, —CH(OH)—O—CH$_2$—, —CH(OH)CH$_2$—O—, —CH(OH)—O—CH$_2$CH$_2$—, —CH(OH)CH$_2$—O—CH$_2$—, —CH(OH)CH$_2$CH$_2$—O—, —CH(OH)—O—CH$_2$CH$_2$CH$_2$—, —CH(OH)CH$_2$—O—CH$_2$CH$_2$—, —CH(OH)CH$_2$CH$_2$—O—CH$_2$—, —C(OH)(CH$_3$)—, —C(CH$_3$)$_2$CH(OH)—, —CH(CH$_3$)CH(OH)—, —C(OH)(CH$_2$CH$_3$)—, —C(OH)(OCH$_3$)—, —C(CF$_3$)(OCH$_2$(OH))—, —CH(OH)—S—, —CH(OH)—S—CH$_2$—, —CH(OH)CH$_2$—S—, —CH(OH)—S—CH$_2$CH$_2$—, —CH(OH)CH$_2$—S—CH$_2$—, —CH(OH)CH$_2$CH$_2$—S—, —CH(OH)—S—CH$_2$CH$_2$CH$_2$—, —CH(OH)CH$_2$—S—CH$_2$CH$_2$—, —CH(OH)CH$_2$CH$_2$—S—

—CH₂—, —C(OH)(CH₂)CH—, —CH(CH₂CH₂(OH))—, —CH(OH)CO—, —CH(OH)CH₂CO—, —CH(CH₃)CH(OH)CO—, —C(OH)(CH₃)—, —C(OH)=CH—, —CH(OH)CH=CH—, —C(OH)=CHCH₂—, —C(OH)=CH—O—, —C(OH)=CH—S— and —C(OH)=CHCO—.

In Formula 11, B is preferably selected from the group consisting of a methyl group, an ethyl group, a t-butyl group, an isopropyl group, and compounds represented by Formulae 12a to 12i:

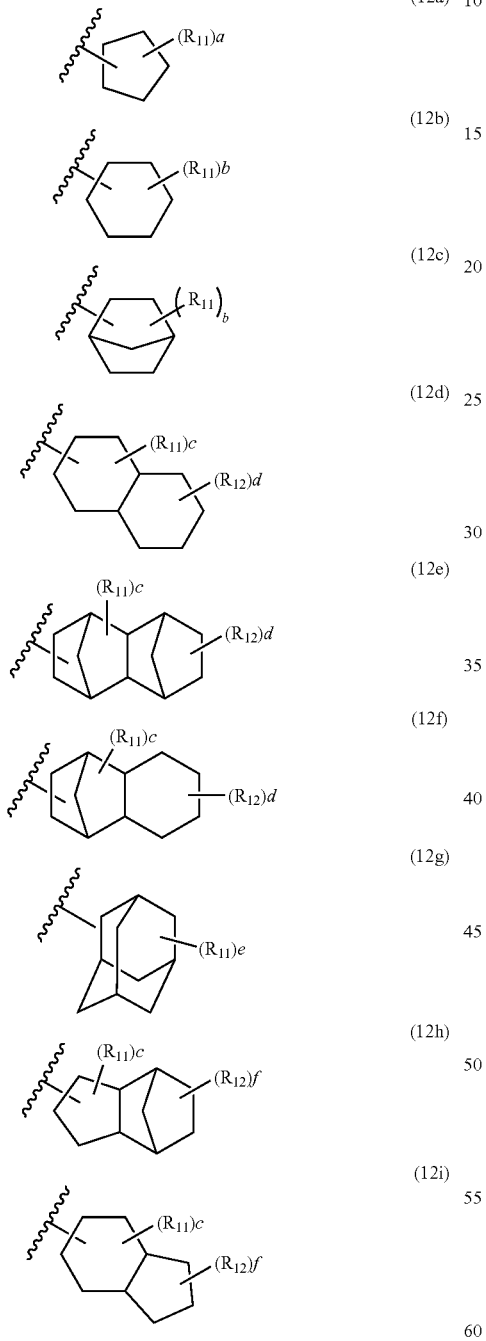

wherein, in Formulae 12a to 12i, $R_{11}$ and $R_{12}$ are each independently selected from the group consisting of hydrogen, a C1 to C10 alkyl group and a C3 to C10 cycloalkyl group; and a, c and d are each independently an integer of 0 to 9; b is an integer of 0 to 11; e is an integer of 0 to 15; and f is an integer of 0 to 7, with the proviso of $0 \leq c+d \leq 17$ and $0 \leq c+f \leq 15$.

The first (meth)acrylic acid ester and the polymerizable monomer are polymerized at a weight ratio of 1:99 to 99:1.

The photoacid generator is selected from the group consisting of compounds represented by Formulae 15 to 23:

[Formula 15]

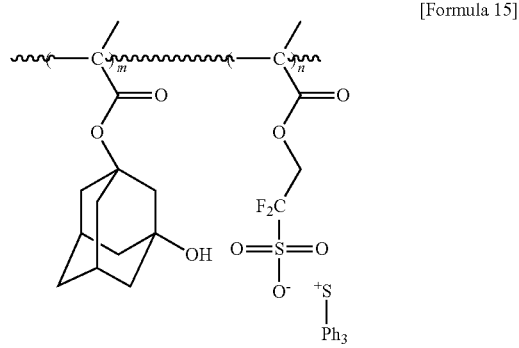

[Formula 16]

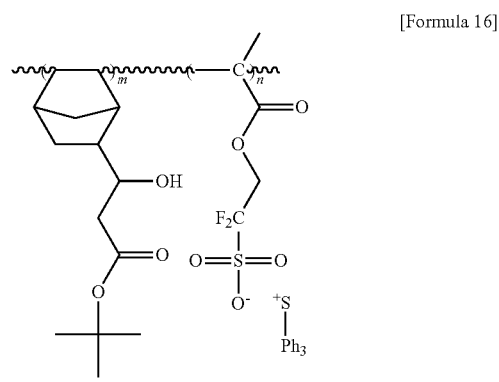

[Formula 17]

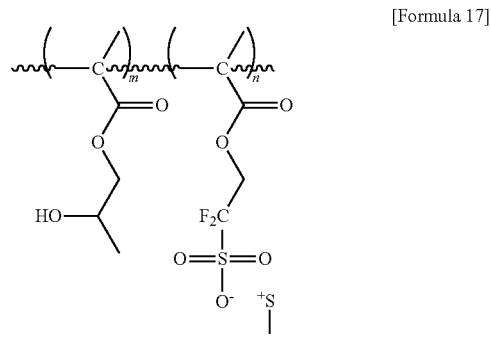

[Formula 18]

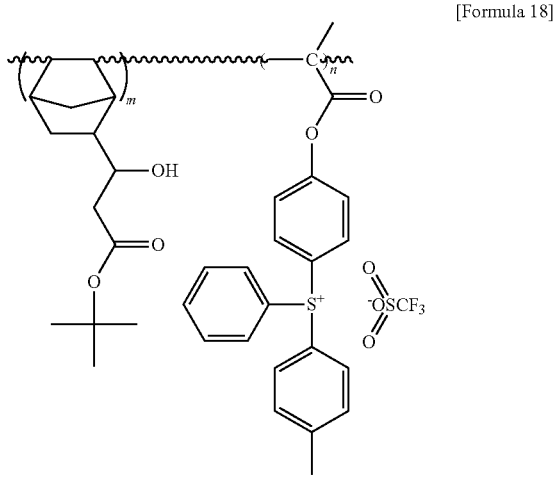

-continued

[Formula 19]

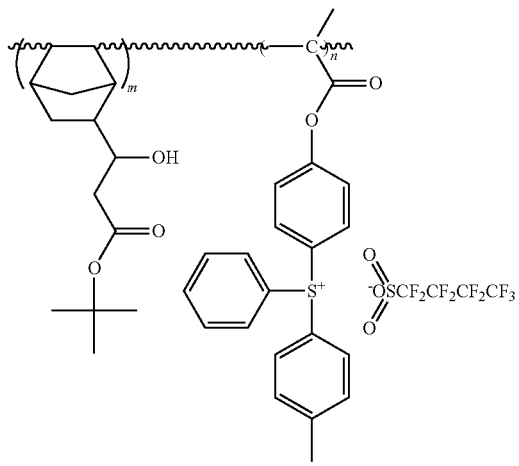

[Formula 20]

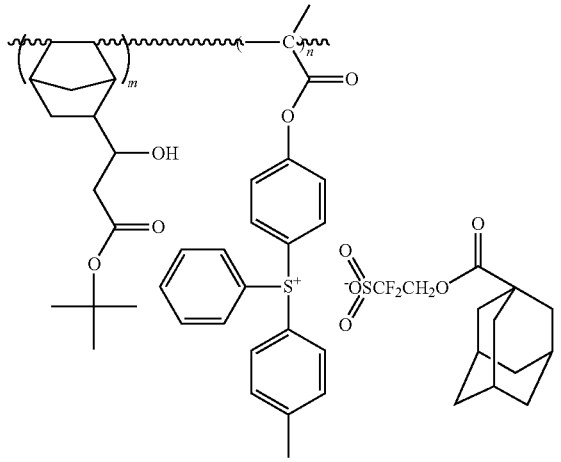

[Formula 21]

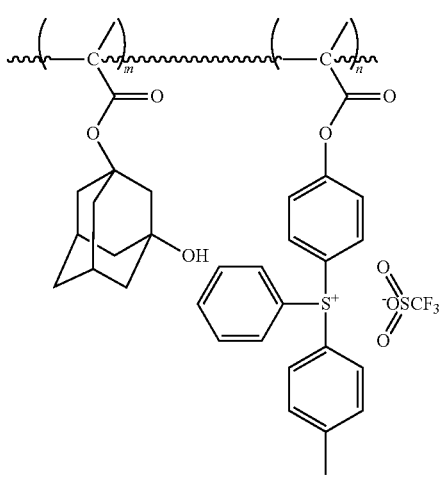

-continued

[Formula 22]

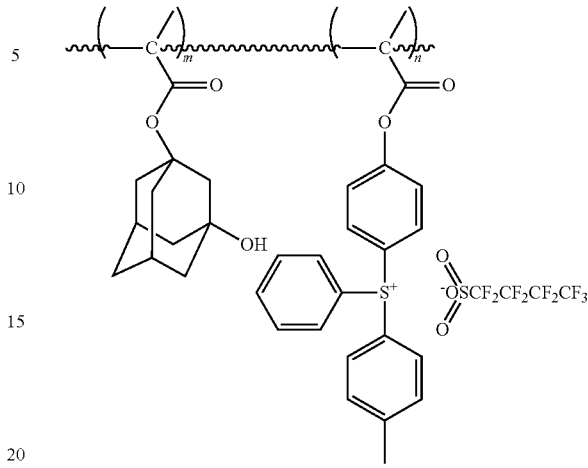

[Formula 23]

wherein, in Formulae 15 to 23, ph represents a phenyl group, and m and n are numbers of repeat units present in the main chain and satisfy m+n=1, o<m/(m+n)≤0.99 and 0<n/(m+n)≤0.99.

The hydrophilic photoacid generator has a weight average molecular weight in terms of polystyrene measured by gel permeation chromatography (GPC) of 1,000 to 500,000 g/mol.

The hydrophilic photoacid generator has a ratio of weight average molecular weight to number average molecular weight of 1 to 5.

In accordance with another aspect of the present invention, provided is a resist composition comprising the hydrophilic photoacid generator according to the present invention.

The hydrophilic photoacid generator is present in an amount of 0.3 to 10 parts by weight, with respect to 100 parts by weight of a solid content of the resist composition.

Details of embodiments of the present invention are included in the following description of the invention.

DETAILED DESCRIPTION OF THE INVENTION

Hereinafter, embodiments of the present invention will be described in detail. However, these embodiments are only provided to illustrate the present invention and should not be construed as limiting the present invention. The present invention is defined by only the scope of claims described below.

Unless specifically stated otherwise, the term "halogen atom" as used herein means any one selected from the group consisting fluorine, chlorine, bromine and iodine.

Unless specifically stated otherwise, the term "alkyl group" as used herein means a linear or branched C1 to C30 alkyl group, and the alkyl group includes a primary alkyl group, a secondary alkyl group and a tertiary alkyl group. Specific examples of the alkyl group include, but are not limited to, a methyl group, an ethyl group, a propyl group, an isopropyl group, a butyl group, an isobutyl group and a t-butyl group.

Unless specifically stated otherwise, the term "cycloalkyl group" as used herein means a C3 to C30 cycloalkyl group and includes monocyclic, bicyclic, tricyclic and tetracyclic cycloalkyl groups. Also, the term includes polycyclic cycloalkyl groups including an adamantyl group and a norbornyl group.

Unless specifically stated otherwise, the term "alkanediyl" as used herein is a divalent atomic group obtained by extracting two hydrogen atoms from an alkane, and may be represented by the general Formula of $-C_nH_{2n}-$. The term alkenediyl means a divalent atomic group obtained by extracting two hydrogen atoms from an alkene, and may be represented by the general Formula of $-C_nH_n-$.

Unless specifically stated otherwise, the prefix "hetero" as herein used means that one to three carbon atoms are substituted by heteroatoms selected from the group consisting of N, O, S and P. For example, a heteroalkyl group means that one to three carbon atoms among the carbon atoms of the alkyl group are substituted by heteroatoms.

Unless specifically stated otherwise, the term "aryl group" as used herein means a compound comprising a benzene ring and a derivative thereof. Examples of the aryl group include: toluene, xylene or the like in which an alkyl side chain is bonded to a benzene ring; biphenyl or the like in which two or more benzene rings are bonded through a single bond; fluorene, xanthene, anthraquinone or the like in which two or more benzene rings are bonded via a cycloalkyl group or a heterocycloalkyl group; and naphthalene, anthracene or the like in which two or more benzene rings are condensed. Unless specifically stated otherwise, the aryl group as used herein means a C6 to C30 aryl group.

Unless specifically stated otherwise, the term "heterocycle" as used herein means a cyclic radical having 4 to 20 ring atoms, in which one or more (for example 1, 2, 3 or 4) carbon atoms are substituted by one or more heteroatoms (for example, N, O, P or S). The term "heterocycle" includes a saturated ring, a partially unsaturated ring, an aromatic ring (that is, a heteroaromatic ring) and a cyclic aromatic radical in which heteroatoms of the ring are oxidized or four-membered to form, for example, an N-oxide or quaternary salt. The substituted heterocycle includes a heterocyclic ring substituted by any substituent disclosed herein in addition to a carbonyl group.

Examples of the heterocycle include, but are not limited to, pyridyl, dihydropyridyl, tetrahydropyridyl(piperidyl), thiazolyl, tetrahydrothiophenyl, sulfur oxidized tetrahydrothiophenyl, pyrimidinyl, furanyl, thienyl, pyrrolyl, pyrazolyl, imidazolyl, tetrazolyl, benzofuranyl, thianaphthalenyl, indolyl, indolenyl, quinolinyl, isoquinolinyl, benzimidazolyl, piperidinyl, 4-piperidonyl, pyrrolidinyl, 2-pyrrolidonyl, pyrrolinyl, tetrahydrofuranyl, tetrahydroquinolinyl, tetrahydroisoquinolinyl, decahydroquinolinyl, octahydroisoquinolinyl, azocinyl, triazinyl, 6H-1,2,5-thiadiazinyl, 2H,6H-1,5,2-dithiazinyl, thienyl, thianthrenyl, pyranyl, isobenzofuranyl, chromenyl, xanthenyl, phenoxathinyl, 2H-pyrrolyl, isothiazolyl, isoxazolyl, pyrazinyl, pyridazinyl, indolizinyl, isoindolyl, 3H-indolyl, 1H-indazoly, purinyl, 4H-quinolizinyl, phthalazinyl, naphthyridinyl, quinoxalinyl, quinazolinyl, cinnolinyl, pteridinyl, 4aH-carbazolyl, carbazolyl, β-carbolinyl, phenanthridinyl, acridinyl, pyrimidinyl, phenanthrolinyl, phenazinyl, phenothiazinyl, furazanyl, phenoxazinyl, isochromanyl, chromanyl, imidazolidinyl, imidazolinyl, pyrazolidinyl, pyrazolinyl, piperazinyl, indolinyl, isoindolinyl, quinuclidinyl, morpholinyl, oxazolidinyl, benzotriazolyl, benzisoxazolyl, oxindolyl, benzoxazolinyl, isatinoyl, bis-tetrahydrofuranyl (in which they may be each independently substituted or unsubstituted) and N-oxides corresponding thereto (for example, pyridyl N-oxide or quinolinyl N-oxide) or quaternary salts thereof.

Unless specifically stated otherwise, all of the compounds and substituents mentioned in the present specification may be substituted or unsubstituted. Here, the term "substituted" means that a hydrogen atom is substituted by any one selected from the group consisting of a halogen atom, an alkyl group, a perfluoroalkyl group, perfluoroalkoxy group, a hydroxyl group, a carboxyl group, a cyano group, a nitrile group, a nitro group, an amino group, a thio group, an alkylthio group, an alkoxy group, an acyl group, an aldehyde group, a cycloalkyl group, a heterocyclic group, an allyl group, an aryl group, derivatives thereof and combinations thereof.

Also, unless specifically stated otherwise, the expression "a combination thereof" as used herein means that two or more substituents are bonded through a single bond or via a linker, or two or more substituents are bonded through condensation.

A resist composition used for semiconductor microfabrication processes using a lithographic process does not exhibit uniform distribution on a resist film after spin coating. Among components constituting the resist composition, distribution of the photoacid generator is particularly non-uniform. The reason for this is that an anionic moiety constituting the photoacid generator contains fluorine. The photoacid generator containing a great amount of fluorine is disposed in an upper part of the resist film after spin coating to make the upper part of the resist film hydrophobic.

In this regard, the present invention is completed based on the discovery that hydrophilicity of the photoacid generator can be improved by incorporating a hydrophilic functional group into an end of repeat units constituting the photoacid generator, thereby reducing a contact angle (C.A.) and uniformly distributing the photoacid generator in the resist film.

That is, the hydrophilic photoacid generator according to one embodiment of the present invention is a poly-membered copolymer prepared by copolymerization of a first (meth) acrylic acid ester having a structure represented by the following Formula 1 or 2, with a polymerizable monomer selected from the group consisting of a second (meth)acrylic acid ester, an olefin-based compound and a mixture thereof, each of which contains a functional group selected from the group consisting of a hydroxyl group, a carboxyl group, a lactone group, a nitrile group and a halogen group:

[Formula 1]

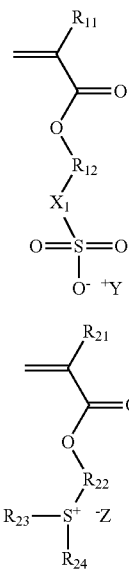

[Formula 2]

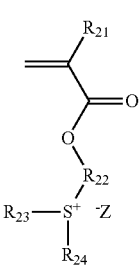

wherein $R_{11}$ and $R_{21}$ are each independently selected from the group consisting of a hydrogen atom, a C1 to C4 alkyl group and a C1 to C4 alkoxy group;

$R_{12}$ and $R_{22}$ are each independently selected from the group consisting of a C1 to C20 alkanediyl group, a C2 to C20 alkenediyl group, a C1 to C20 heteroalkanediyl group, a C2 to C20 heteroalkenediyl group, a C3 to C30 cycloalkanediyl group, a C3 to C30 cycloalkenediyl group, a C2 to C30 heterocycloalkanediyl group and a C3 to C30 heterocycloalkenediyl group;

$R_{23}$ and $R_{24}$ are each independently selected from the group consisting of a hydrogen atom, a C1 to C20 alkyl group, a C1 to C20 alkenyl group, a C3 to C30 cycloalkyl group, a C3 to C30 cycloalkenyl group, a C6 to C30 aryl group and a C2 to C30 heterocyclic group, or $R_{23}$ and $R_{24}$ are bonded to each other to form a C3 to C30 saturated or unsaturated hydrocarbon ring;

$X_1$ is selected from the group consisting of: a C1 to C20 alkanediyl group containing a functional group selected from the group consisting of a halogen group, a C1 to C5 haloalkyl group and a cyano group; a C6 to C30 arylene group; and a C5 to C30 heteroarylene group;

$Y^+$ is a compound represented by the following Formula 3:

[Formula 3]

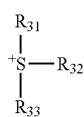

wherein $R_{31}$, $R_{32}$ and $R_{33}$ are each independently selected from the group consisting of a C1 to C20 alkyl group, a C2 to C20 alkenyl group, a C3 to C30 cycloalkyl group, a C3 to C30 cycloalkenyl group and a C6 to C30 aryl group, wherein one or more hydrogen atoms of $R_{31}$, $R_{32}$ and $R_{33}$ are each independently substituted by any substituent selected from the group consisting of a halogen group, a hydroxyl group, a carboxyl group, a thio group, a C1 to C10 alkyl group, a C1 to C10 alkoxy group, a C6 to C18 aryl group, a (C1 to C10 alkyl)thio group, a C6 to C18 aryloxy group, a (meth)acryloyloxy group, a (C1 to C10 alkyl)carbonyloxy group and a combination thereof; and $Z^-$ is a compound represented by the following Formula 4:

[Formula 4]

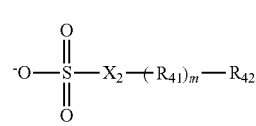

wherein $R_{41}$ is selected from the group consisting of a C1 to C20 alkanediyl group, a C2 to C20 alkenediyl group, a C1 to C20 heteroalkanediyl group, a C2 to C20 heteroalkenediyl group, a C3 to C30 cycloalkanediyl group, a C3 to C30 cycloalkenediyl group, a C2 to C30 heterocycloalkanediyl group and a C3 to C30 heterocycloalkenediyl group, $R_{42}$ is selected from the group consisting of a hydrogen atom, a halogen atom, a C1 to C20 alkyl group, a C2 to C20 alkenyl group, a C1 to C20 alkoxy group, a C1 to C20 alkoxyalkyl group, a C1 to C20 haloalkyl group, a C1 to C20 haloalkoxy group, a C1 to C20 alkylthio group, a C3 to C30 cycloalkyl group, a C3 to C30 cycloalkenyl group, a C6 to C30 aryl group, a C7 to C30 aralkyl group, a C5 to C30 heterocyclic group and

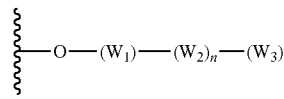

(wherein $W_1$ is —(C=O)— or —(SO$_2$)—; $W_2$ is a C1 to C10 alkanediyl group or a C1 to C10 heteroalkanediyl group; and $W_3$ is selected from the group consisting of a hydrogen atom, a halogen group, a C1 to C10 alkyl group, a C2 to O20 alkenyl group, a C1 to C10 alkoxy group, a C1 to C10 haloalkyl group, a (C1 to C10 alkyl)thio group, a C3 to C30 cycloalkyl group, a C6 to C30 aryl group, a (C6 to C30 aryl)oxy group, a (C6 to C30 aryl)thio group, a C5 to C30 heterocyclic group and a combination thereof);

$X_2$ is a C1 to C20 haloalkanediyl group in which at least one hydrogen atom is substituted by a halogen group; and m and n are each independently 0 or 1.

Specifically, in Formulae 1 and 2, $R_{11}$ and $R_{21}$ are each independently a hydrogen atom or a C1 to C4 alkyl group and are preferably hydrogen or a methyl group.

In Formulae 1 and 2, $R_{12}$ and $R_{22}$ are preferably each independently selected from the group consisting of a C1 to C10 alkanediyl group, a C2 to C10 alkanediyl group, a C1 to C10 heteroalkanediyl group, a C2 to C10 heteroalkenediyl group, a C3 to C18 cycloalkanediyl group, a C3 to C18 cycloalkenediyl group, a C2 to C18 heterocycloalkanediyl group and a C3 to C18 heterocycloalkenediyl, and are more preferably each independently selected from the group consisting of a methylene group, an ethylene group, a 1,3-propylene group, a 1,2-propylene group, a tetramethylene group, a pentamethylene group, a 2,2-dimethylpentamethylene group, a hexamethylene group, a heptamethylene group, an octamethylene group, a nonamethylene group, a decamethylene group, a undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, a 2-propylidene group, a 1,3-cyclobutylene group, a 1,3-cyclopentylene group, a 1,4-cyclohexylene group, a 1,5-cyclooctylene group, a 1,4-norbornylene group, a 2,5-norbornylene group, a 1,5-adamantylene group, a 2,6-adamantylene group, —OCH$_2$—, OCH(Cl)—, —CO—, —COCH$_2$—, —COCH$_2$CH$_2$—, —CH$_2$—O—CH$_2$—, —CH$_2$—O—CH$_2$CH$_2$—, —CH$_2$CH$_2$—O—CH$_2$—, —CH$_2$—O—CH$_2$CH$_2$CH$_2$—, —CH$_2$CH$_2$—O—CH$_2$CH$_2$—, —CH$_2$CH$_2$CH$_2$—O—CH$_2$—, —C(CH$_3$)$_2$CH$_2$—, —CH(CH$_3$)CH$_2$—, —CH(CH$_2$CH$_3$)—, —CH(OCH$_3$)—, —C(CF$_3$)(OCH$_3$)—, —CH$_2$—S—CH$_2$—, —CH$_2$—S—CH$_2$CH$_2$—, —CH$_2$CH$_2$—S—CH$_2$—, —CH$_2$—S—CH$_2$CH$_2$CH$_2$—, —CH$_2$CH$_2$—S—CH$_2$CH$_2$—, —CH$_2$CH$_2$CH$_2$—S—CH$_2$—, —CH(CH$_2$)CH—, —C(CH$_2$CH$_2$)—, —CH$_2$CO—, —CH$_2$CH$_2$CO—, —CH(CH$_3$)CH$_2$CO—, —CH(OH)—, —C(OH)(CH$_3$)—, —CH(F)—, —CH(Br)—, —CH(Br)CH(Br)—, —CH=CH—, —CH$_2$CH=CH—, —CH=CHCH$_2$—, —CH=CHCO—, —C$_7$H$_9$— and —C10H$_{14}$—.

In Formulae 1 and 2, $R_{23}$ and $R_{24}$ are preferably each independently selected from the group consisting of a C1 to C10 alkyl group, a C1 to C10 alkenyl group, a C3 to C14 monocyclic cycloalkyl group, a C8 to C18 bicyclic cycloalkyl group, a C10 to C30 tricyclic cycloalkyl group, a C10 to C30 tetracyclic cycloalkyl group, a C3 to C18 cycloalkenyl group, a C6 to C18 aryl group and a C2 to C30 heterocyclic group, and are more preferably selected from the group consisting of a C1 to C4 alkyl group, a C2 to C4 alkenyl group and compounds represented by Formulae 5a to 5u:

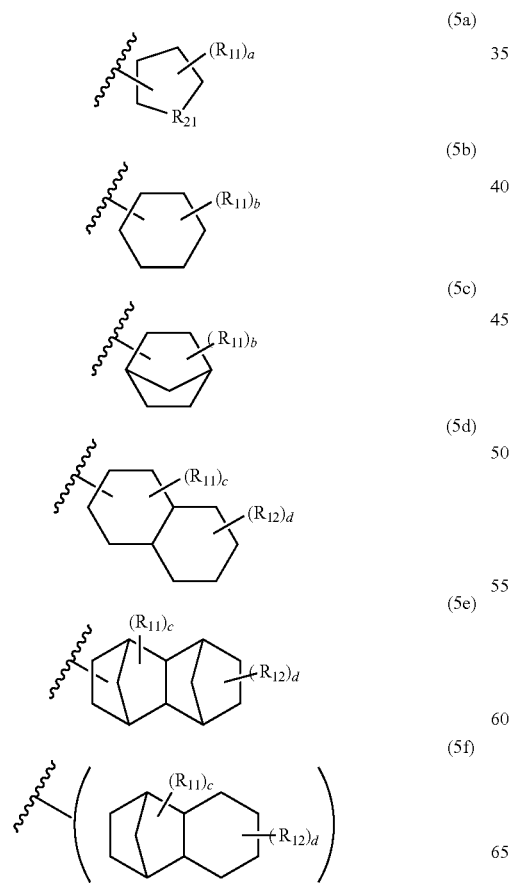

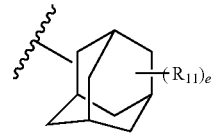

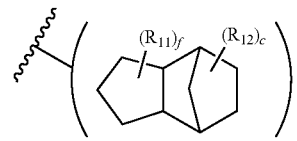

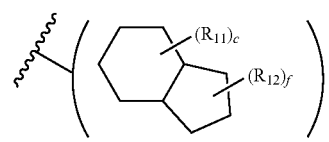

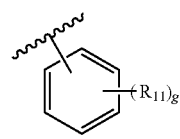

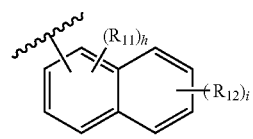

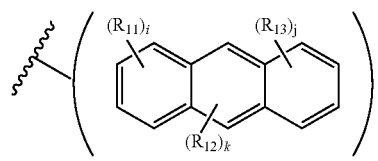

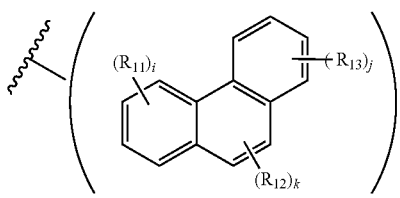

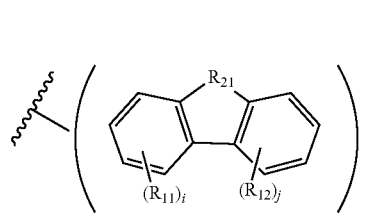

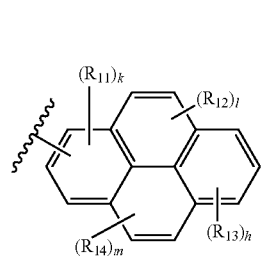

-continued

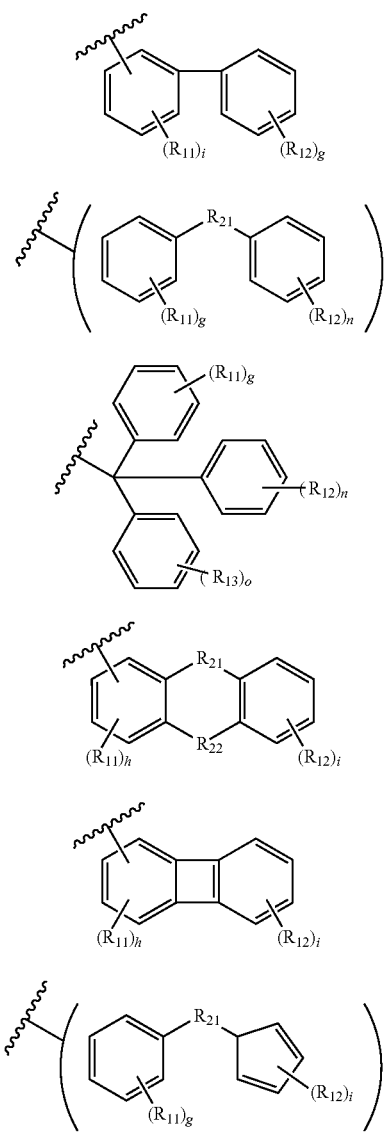

wherein, in Formulae 5a to 5u, $R_{11}$, $R_{12}$, $R_{13}$ and $R_{14}$ are each independently selected from the group consisting of a halogen atom, an alkyl group, a perfluoroalkyl group, a perfluoroalkoxy group, a hydroxyl group, a carboxyl group, a cyano group, a nitrile group, a nitro group, an amino group, a thio group, an alkylthio group, an aldehyde group, a cycloalkyl group, a heterocyclic group, an allyl group, an aryl group, $OR_a$, $COR_a$ and $COOR_a$, wherein $R_a$ is an alkyl group or an aryl group; $R_{21}$ and $R_{22}$ are each independently selected from the group consisting of $CR_bR_c$, O, CO, S and $NR_d$, wherein $R_b$ to $R_d$ are each independently selected from the group consisting of a hydrogen atom, an alkyl group and an aryl group; and a and f are an integer of 0 to 7; b is an integer of 0 to 11; c and d are each independently an integer of 0 to 9; e is an integer of 0 to 15; g, n, q, r and s are each independently an integer of 0 to 5; h, i and j are each independently an integer of 0 to 3; k, l and m are each independently an integer of 0 to 2; and o and p are an integer of 0 to 4, with the proviso of $0 \le c+d \le 17$, $0 \le c+f \le 15$, $0 \le i+j+k \le 9$, $0 \le h+i \le 7$, $0 \le o+p \le 9$, and $0 \le h+o \le 8$.

In addition, in Formula 1, $X_1$ is preferably selected from the group consisting of a C1 to C10 alkanediyl group containing a functional group selected from the group consisting a fluoro group, a perfluoroalkyl group and a cyano group; a C6 to C18 arylene group; and a heteroarylene group, and is more preferably selected from the group consisting of a difluoromethylene group, a cyanomethylene group and a benzenediyl group.

In Formula 1, $Y^+$ is the compound represented by Formula 3, and in Formula 3, $R_{31}$, $R_{32}$ and $R_{33}$ are each independently selected from the group consisting of a C1 to C10 alkyl group, a C1 to C10 alkenyl group, a C3 to C14 monocyclic cycloalkyl group, a C8 to C18 bicyclic cycloalkyl group, a C10 to C30 tricyclic cycloalkyl group, a C10 to C30 tetracyclic cycloalkyl group, a C3 to C18 cycloalkenyl group and a C6 to C18 aryl group, wherein one or more hydrogen atoms of $R_{31}$, $R_{32}$ and $R_{33}$ may be each independently substituted by any substituent selected from the group consisting of a halogen group, a hydroxyl group, a carboxyl group, a thio group, a C1 to C10 alkyl group, a C1 to C10 alkoxy group, a C6 to C18 aryl group, a (C1 to C10 alkyl)thio group, a C6 to C18 aryloxy group, a (meth)acryloyloxy group, a (C1 to C10 alkyl)carbonyloxy group and a combination thereof.

More preferably, $Y^+$ may have one of structures represented by Formulae 6a to 6r below:

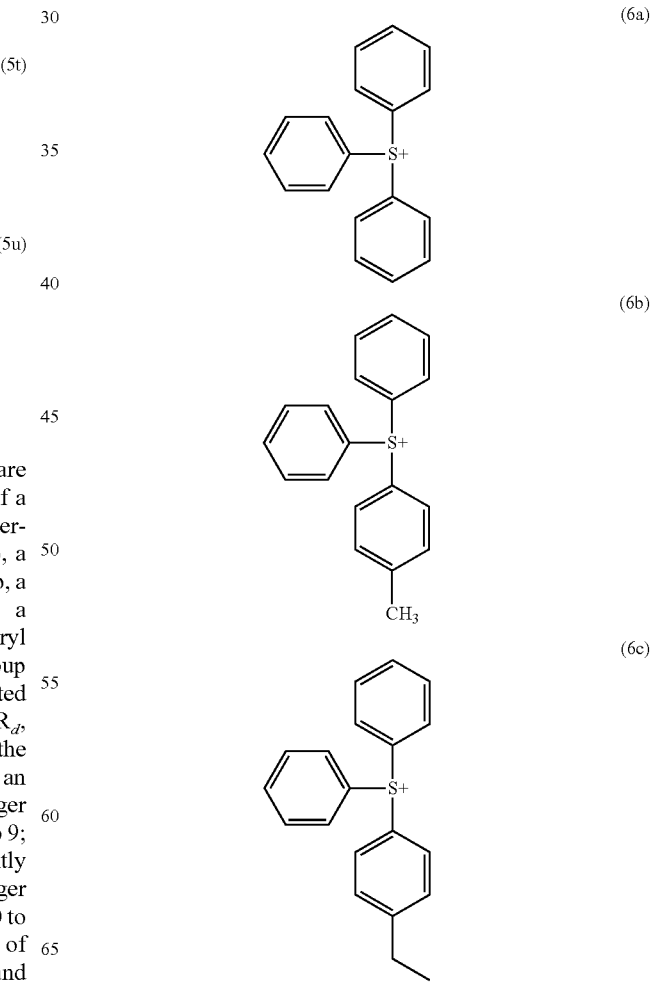

(6d)
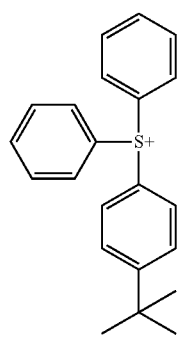
(6e)
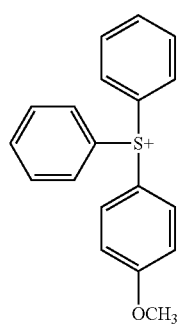
(6f)
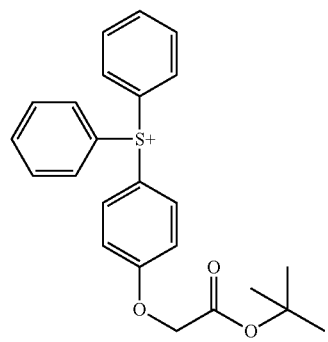
(6g)
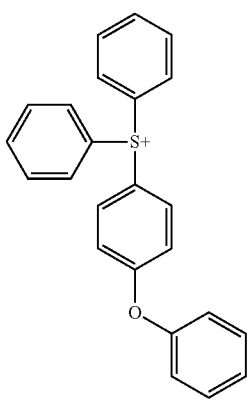
(6h)
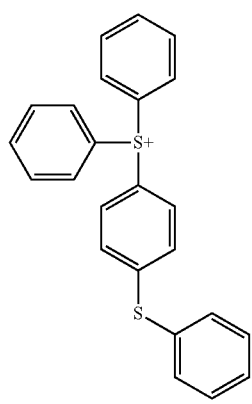
(6i)
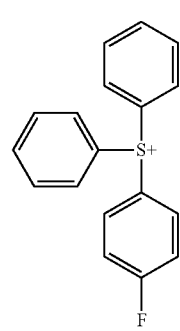
(6j)
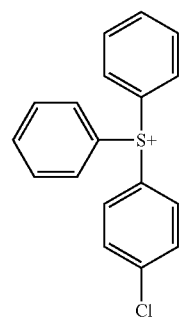
(6k)
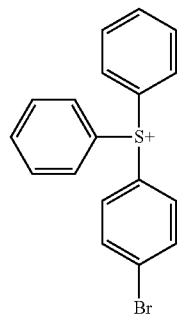

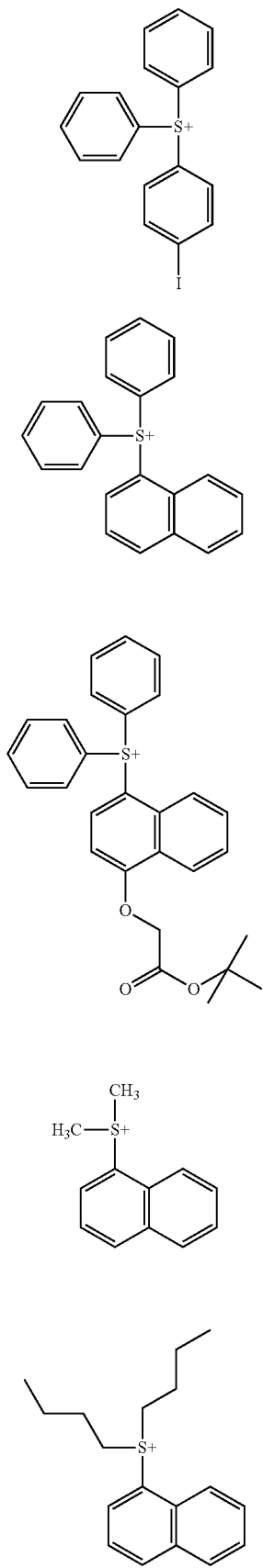

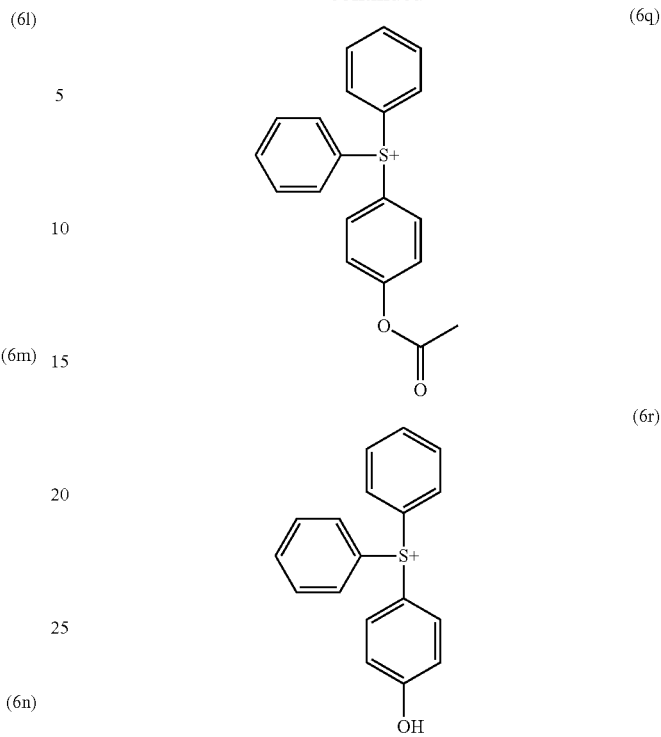

Also, in Formula 2, $Z^-$ is the compound represented by Formula 4, and in Formula 4, $R_{41}$ is preferably selected from the group consisting of a C1 to C10 alkanediyl group, a C2 to C10 alkenediyl group, a C1 to C10 heteroalkanediyl group, a C2 to C10 heteroalkenediyl group, a C3 to C14 monocyclic cycloalkanediyl group, a C8 to C18 bicyclic cycloalkanediyl group, a C10 to C30 tricyclic cycloalkanediyl group, a C10 to C30 tetracyclic cycloalkanediyl group, a C3 to C18 cycloalkenediyl group, a C2 to C18 heterocycloalkanediyl group and a C3 to C18 heterocycloalkenediyl group, and is more preferably selected from the group consisting of a methylene group, an ethylene group, a 1,3-propylene group, a 1,2-propylene group, a tetramethylene group, a pentamethylene group, a 2,2-dimethylpentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, a 2-propylidene group, a 1,3-cyclobutylene group, a 1,3-cyclopentylene group, a 1,4-cyclohexylene group, a 1,5-cyclooctylene group, a 1,4-norbornyl group, a 2,5-norbornyl group, a 1,5-adamantylene group, a 2,6-adamantylene group, —OCH$_2$—, —OCH(Cl)—, —CO—, —COCH$_2$—, —COCH$_2$CH$_2$—, —CH$_2$—O—CH$_2$—, —CH$_2$—O—CH$_2$CH$_2$—, —CH$_2$—CH$_2$—CH$_2$—, —CH$_2$O—CH$_2$CH$_2$CH$_2$—, —CH$_2$CH$_2$—O—CH$_2$CH$_2$—, —CH$_2$CH$_2$CH$_2$—O—CH$_2$—, —C(CH$_3$)$_2$CH$_2$—, —CH(CH$_3$)CH$_2$—, —CH(CH$_2$CH$_3$)—, —CH(OCH$_3$)—, —C(CF$_3$)(OCH$_3$)—, —CH$_2$—S—CH$_2$—, —CH$_2$—S—CH$_2$CH$_2$—, —CH$_2$CH$_2$—S—CH$_2$—, —CH$_2$—S—CH$_2$CH$_2$CH$_2$—, —CH$_2$CH$_2$—S—CH$_2$CH$_2$—, —CH$_2$CH$_2$CH$_2$—S—CH$_2$—, —CH(CH$_2$)CH—, —C(CH$_2$CH$_2$)—, —CH$_2$CO—, —CH$_2$CH$_2$CO—, —CH(CH$_3$)CH$^2$CO—, —CH(OH)—, —C(OH)(CH$_3$)—, —CH (F)—, —CH(Br)—, —CH(Br)CH(Br)—, —CH=CH—, —CH₂CH=CH—, —CH=CHCH₂—, —CH=CHCO—, —C₇H₉— and —C₁₀H₁₄—.

$R_{42}$ is preferably selected from the group consisting of a hydrogen atom, a halogen atom, a C1 to C10 alkyl group, a C2 to C10 alkenyl group, a C1 to C10 alkoxy group, a C2 to C10 alkoxyalkyl group, a C1 to C10 haloalkyl group, a C1 to C10 haloalkoxy group, a C1 to C10 alkylthio group, a C3 to C14 monocyclic cycloalkyl group, a C8 to C18 bicyclic cycloalkyl group, a C10 to C30 tricyclic cycloalkyl group, a C10 to C30 tetracyclic cycloalkyl group, a C3 to C18 cycloalkenyl group, a C6 to C18 aryl group, a C7 to C18 aralkyl group and

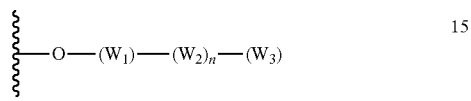

(wherein $W_1$ is —(C=O)— or —(SO₂)—; $W_2$ is a C1 to C5 alkanediyl group or a C1 to C5 heteroalkanediyl group; and $W_3$ is a hydrogen atom, a halogen group, a C1 to C5 alkyl group, a C2 to C10 alkenyl group, a C1 to C5 alkoxy group, a C1 to C5 haloalkyl group, a (C1 to C5 alkyl)thio group, a C3 to C5 cycloalkyl group, a C6 to C18 aryl group, a (C6 to C18 aryl)oxy group, a (C6 to C18 aryl)thio group, a C5 to C18 heterocyclic group and a combination thereof).

$X_2$ is preferably a C1 to C10 fluoroalkanediyl group in which at least one hydrogen atom is substituted by a fluoro group and is more preferably a difluoromethylene group.

Specifically, in Formula 2, $Z^-$ is selected from the group consisting of functional groups represented by Formulae 7a to 7n and 8a to 8x:

(7a)

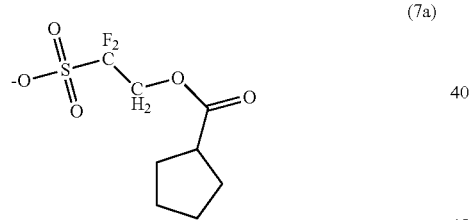

(7b)

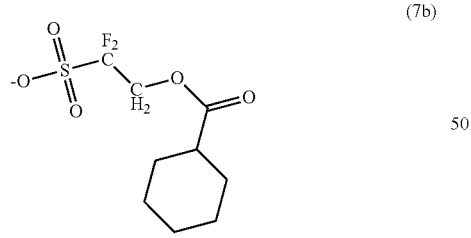

(7c)

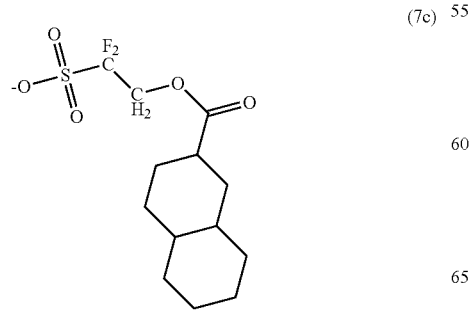

-continued (7d)

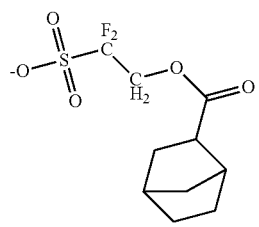

(7e)

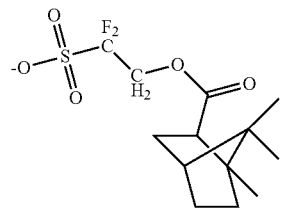

(7f)

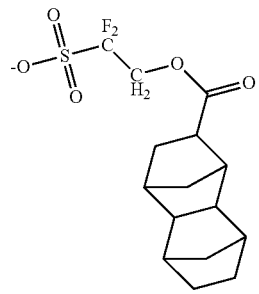

(7g)

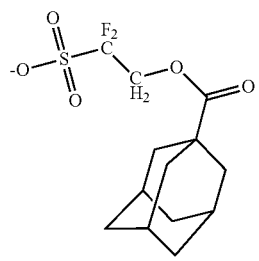

(7h)

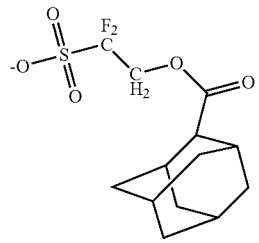

(7i)

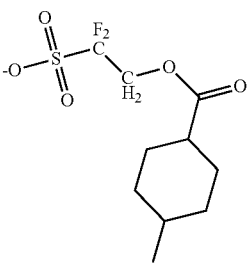

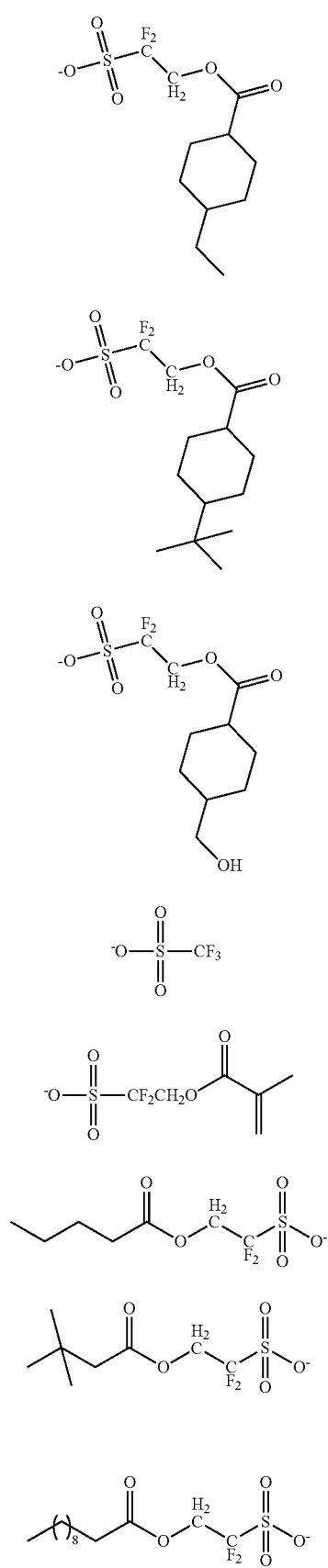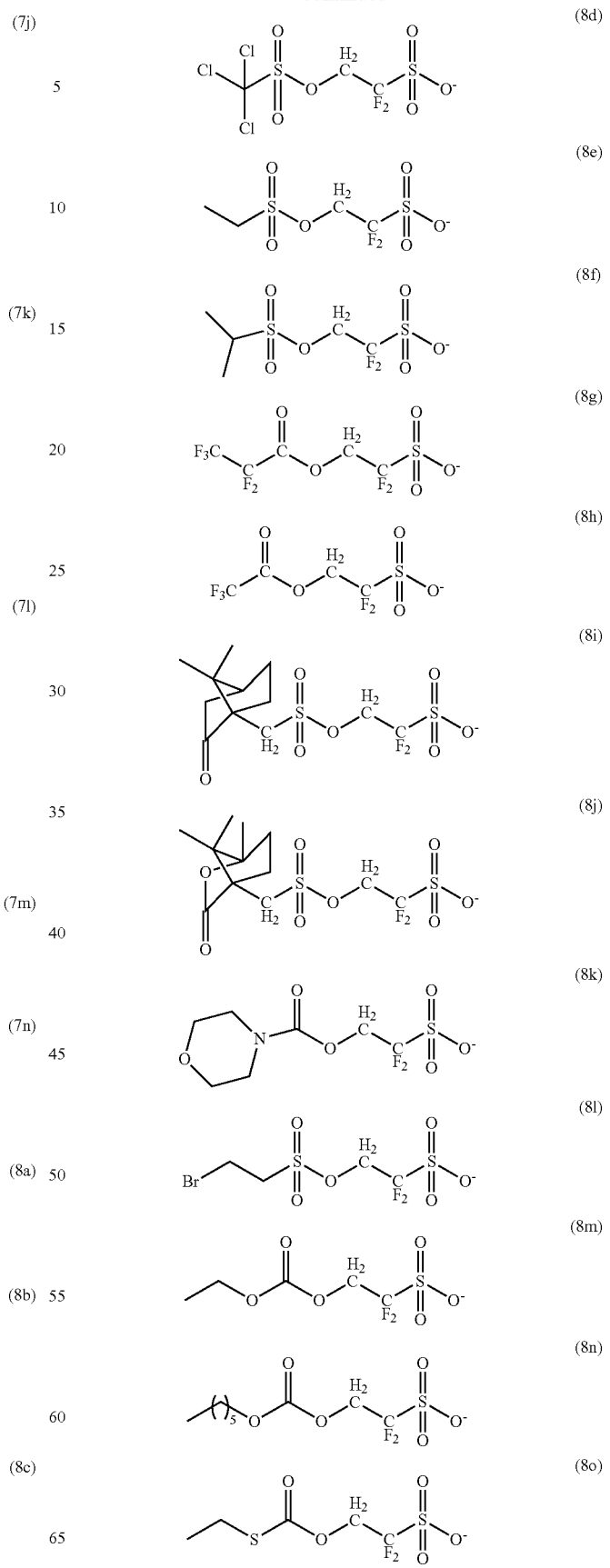

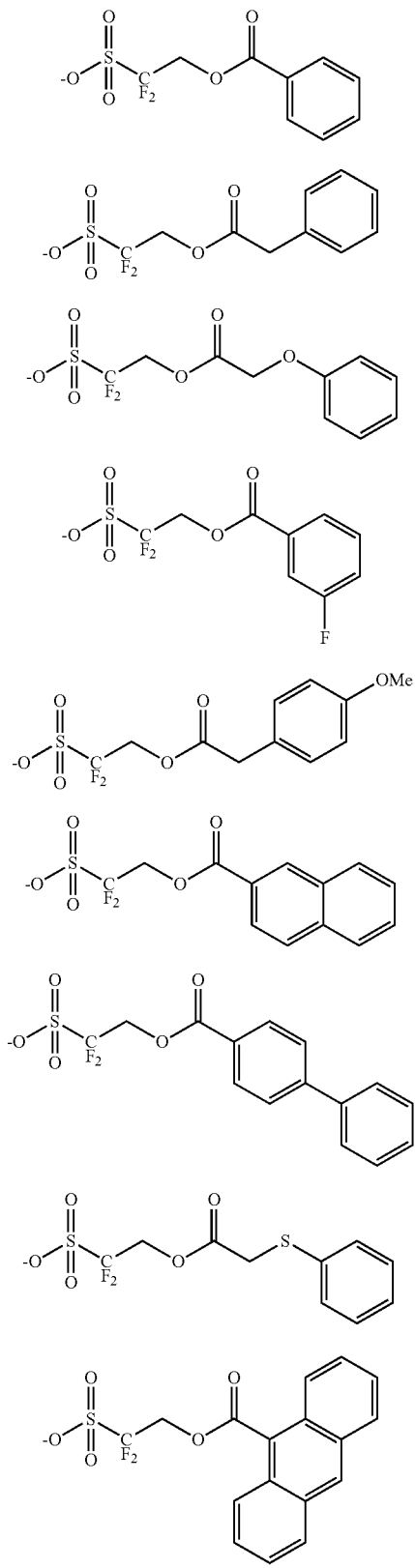

(8p)
(8q)
(8r)
(8s)
(8t)
(8u)
(8v)
(8w)
(8x)

The second (meth)acrylic acid ester that can be copolymerized with the first (meth)acrylic acid ester is preferably represented by the following Formula:

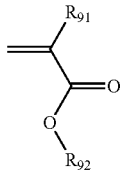

[Formula 9]

wherein $R_{91}$ is selected from the group consisting of a hydrogen atom, a C1 to C4 alkyl group and a C1 to C4 alkoxy group; and $R_{92}$ is a hydrogen atom or is selected from the group consisting of a C1 to C20 alkyl group, a C2 to C20 alkenyl group, a C3 to C30 cycloalkyl group, a C3 to C30 cycloalkenyl group, a C6 to C30 aryl group, a C2 to C30 heterocyclic group and a combination thereof, each of which contains a functional group selected from the group consisting of a hydroxyl group, a carboxyl group, a lactone group, a nitrile group and a halogen group.

In Formula 9, $R_{91}$ is preferably a hydrogen atom or a methyl group.

Also, $R_{92}$ is an hydrogen atom, or is selected from the group consisting of a C1 to C10 alkyl group, a C2 to C10 alkenyl group, a C3 to C14 monocyclic cycloalkyl group, a C8 to C18 bicyclic cycloalkyl group, a C10 to C30 tricyclic cycloalkyl group, a C10 to C30 tetracyclic cycloalkyl group, a C3 to C18 cycloalkenyl group, a C6 to C18 aryl group, a C2 to C18 heterocyclic group and a combination thereof, each of which contains a functional group selected from the group consisting of a hydroxyl group, a carboxyl group, a lactone group, a nitrile group and a halogen group, and is more preferably selected from the group consisting of a hydroxymethyl group, a hydroxyethyl group, a hydroxypropyl group, a 2-hydroxypropyl group and compounds represented by Formulae 10-1 to 10-30:

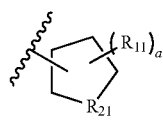

(10-1)

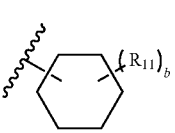

(10-2)

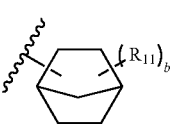

(10-3)

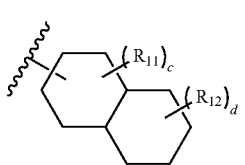

(10-4)

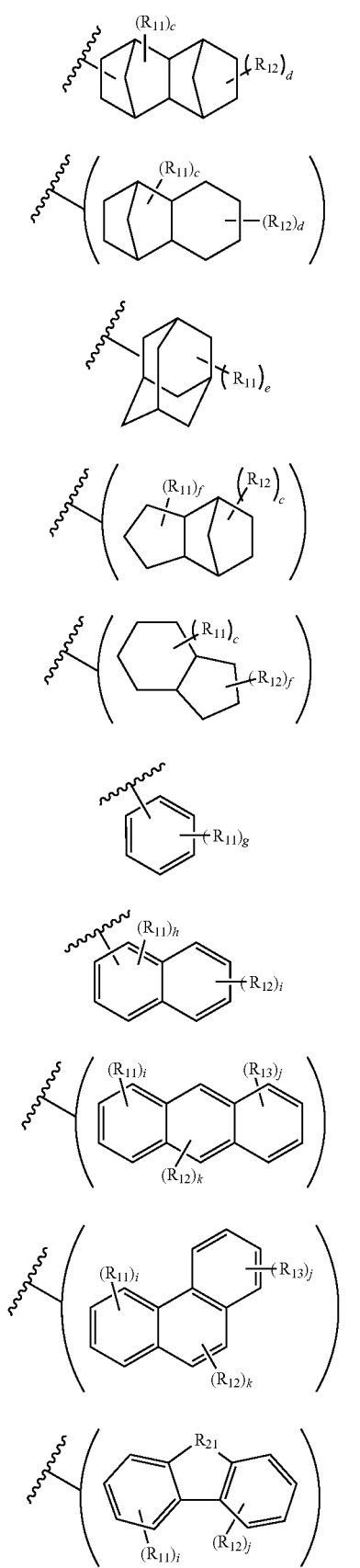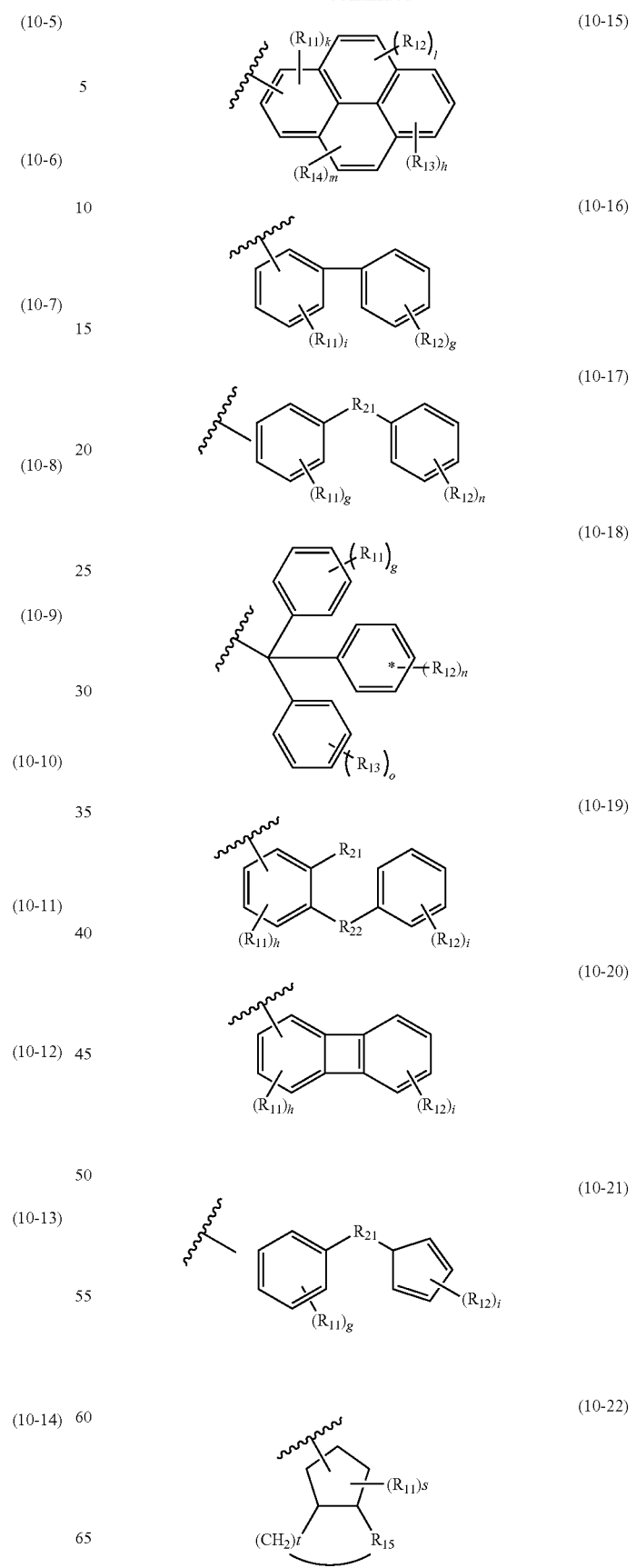

-continued (10-23) 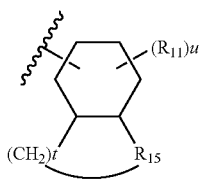

(10-24) 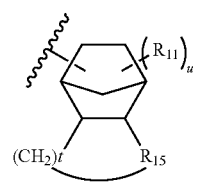

(10-25) 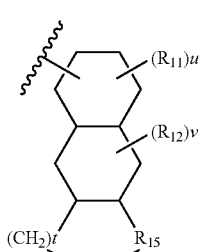

(10-26) 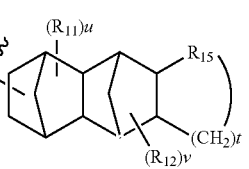

(10-27) 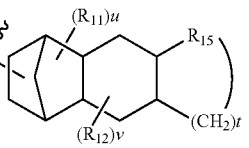

(10-28) 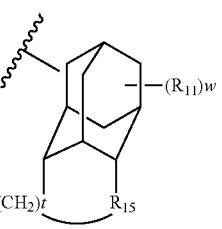

(10-29) 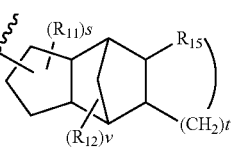

(10-30) 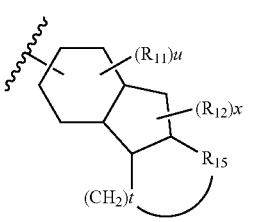

wherein $R_{11}$, $R_{12}$, $R_{13}$, and $R_{14}$ are each independently a hydroxyl group or a carboxyl group; $R_{15}$ is a C1 to C3 heteroalkanediyl group containing a carbonyl group which is bonded to a neighboring group to form a lactone group; $R_{21}$ and $R_{22}$ are each independently selected from the group consisting of $CR_aR_b$, O, CO, S and $NR_c$, wherein $R_a$ to $R_c$ are each independently selected from the group consisting of a hydrogen atom, a C1 to C5 alkyl group and a C6 to C18 aryl group; and a and f are an integer of 0 to 7, b is an integer of 0 to 11; c and d are each independently an integer of 0 to 9; e is an integer of 0 to 15; g, n, q, r and s are each independently an integer of 0 to 5; h, i and j are each independently an integer of 0 to 3; k, l, m and x are each independently an integer of 0 to 2; o, p and v are each independently an integer of 0 to 4; t is an integer of 1 or 2; u is an integer of 0 to 7; and w is an integer of 0 to 13, with the proviso of $0 \le c+d \le 17$, $0 \le c+f \le 15$, $0 \le i+j+k \le 9$, $0 \le h+i \le 7$, $0 \le o+p \le 9$, and $0 \le h+o \le 8$.

The olefin-based compound that can be copolymerized with the first (meth)acrylic acid ester may be selected from the group consisting of cyclic olefin, vinyl, styrene and a derivative thereof, each of which contains a functional group selected from the group consisting of a hydroxyl group, a carboxyl group, a lactone group, nitro and halogen, and the olefin-based compound is more preferably a compound represented by the following Formula 11:

[Formula 11]

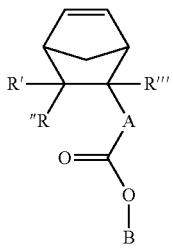

wherein R', R" and R''' are each independently a hydrogen atom or a C1 to C8 alkyl group;

A is selected from the group consisting of a C1 to C20 alkanediyl group, a C2 to C20 alkenediyl group, a C3 to C30 cycloalkanediyl group, a C3 to C30 cycloalkenediyl group, a C1 to C20 heteroalkanediyl group, a C2 to C20 heteroalkenediyl group, a C2 to C30 heterocyclic group and a combination thereof, each of which contains a functional group selected from the group consisting of a hydroxyl group, a carboxyl group, a lactone group, a nitro group and a halogen group; and B is selected from the group consisting of a C1 to C20 alkyl group, a C1 to C20 alkenyl group, a C3 to C30 cycloalkyl group, a C3 to C30 cycloalkenyl group, a C6 to C30 aryl group, a C1 to C20 heteroalkyl group, a C2 to C30 heterocyclic group and a combination thereof.

In Formula 11, R', R" and R''' are preferably each independently a hydrogen atom or a methyl group.

Also, in Formula 11, A is preferably selected from the group consisting of a C1 to C10 alkanediyl group, a C2 to C10 alkenediyl group, a C3 to C14 monocyclic cycloalkanediyl group, a C8 to C18 bicyclic cycloalkanediyl group, a C10 to C30 tricyclic cycloalkanediyl group, a C10 to C30 tetracyclic cycloalkanediyl group, a C6 to C18 cycloalkenediyl group, a C1 to C10 heteroalkanediyl group, a C2 to C10 heteroalkenediyl group, a C5 to C18 heterocyclic group and a combination thereof, each of which contains a hydroxyl group, and is more preferably selected from the group consisting of —OCH(OH)—, —COCH(OH)—, —COCH$_2$CH(OH)—, CH(OH)—, —CH(OH)CH$_2$—, —CH(OH)—O—, —CH(OH)—O—CH$_2$—, —CH(OH)CH$_2$—O—, —CH(OH)—

O—CH$_2$CH$_2$—, —CH(OH)CH$_2$—O—CH$_2$—, —CH(OH)CH$_2$CH$_2$—O—, —CH(OH)—O—CH$_2$CH$_2$CH$_2$—, —CH(OH)CH$_2$—O—CH$_2$CH$_2$—, —CH(OH)CH$_2$CH$_2$O—CH$_2$—, —C(OH)(CH$_3$)—, —C(CH$_3$)$_2$CH(OH)—, —CH(CH$_3$)CH(OH)—, —C(OH)(CH$_2$CH$_3$)—, —C(OH)(OCH$_3$)—, —C(CF$_3$)(OCH$_2$(OH))—, —CH(OH)—S—, —CH(OH)—S—CH$_2$—, —CH(OH)CH$_2$—S—, —CH(OH)—S—CH$_2$CH$_2$—, —CH(OH)CH$_2$—S—CH$_2$—, —CH(OH)CH$_2$CH$_2$—S—, —CH(OH)—S—CH$_2$CH$_2$CH$_2$—, —CH(OH)CH$_2$—S—CH$_2$CH$_2$—, —CH(OH)CH$_2$CH$_2$—S—CH$_2$—, —C(OH)(CH$_2$)CH—, —CH(CH$_2$CH$_2$(OH))—, —CH(OH)CO—, —CH(OH)CH$_2$CO—, —CH(CH$_3$)CH(OH)CO—, —C(OH)(CH$_3$)—, —C(OH)=CH—, —CH(OH)CH=CH—, —C(OH)=CHCH$_2$—, —C(OH)=CH—O—, —C(OH)=CH—S— and —C(OH)=CHCO—.

In Formula 11, B is preferably selected from the group consisting of a C1 to C10 alkyl group, a C1 to C10 alkenyl group, a C3 to C14 monocyclic cycloalkyl group, a C8 to C18 bicyclic cycloalkyl group, a C10 to C30 tricyclic cycloalkyl group, a C10 to C30 tetracyclic cycloalkyl group, a C3 to C18 cycloalkenyl group, a C6 to C18 aryl group and a C7 to C18 aralkyl group, and is more preferably selected from the group consisting of a methyl group, an ethyl group, a t-butyl group, an isopropyl group, and compounds represented by Formulae 12a to 12i.

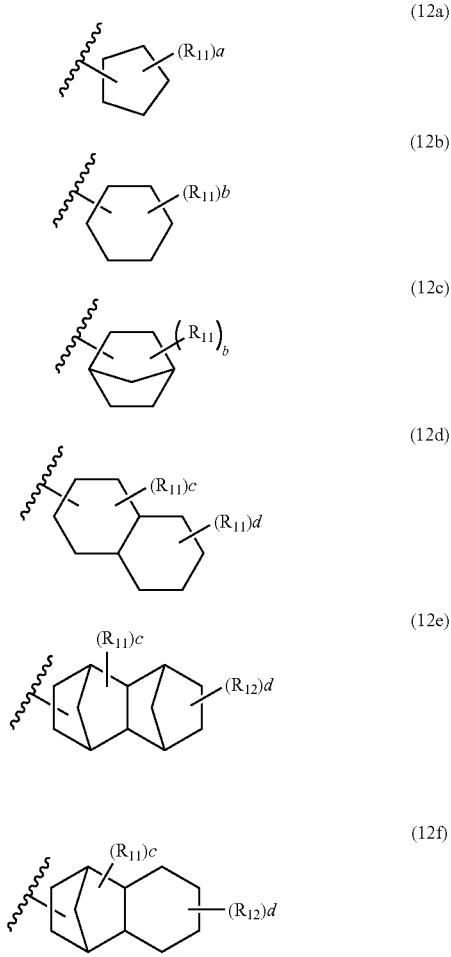

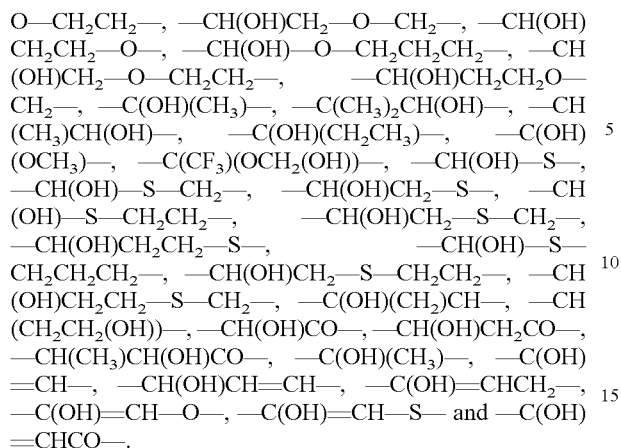

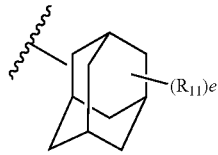

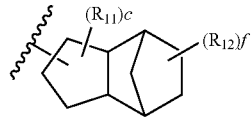

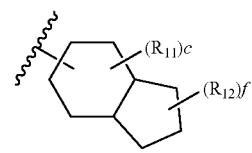

In Formulae 12a to 12i, $R_{11}$ and $R_{12}$ are each independently selected from the group consisting of hydrogen, a C1 to C10 alkyl group and a C3 to C10 cycloalkyl group; and a, c and d are each independently an integer of 0 to 9; b is an integer of 0 to 11; e is an integer of 0 to 15; and f is an integer of 0 to 7, with the proviso of $0 \leq c+d \leq 17$ and $0 \leq c+f \leq 15$.

The hydrophilic photoacid generator according to the present invention may be prepared by polymerizing the first (meth)acrylic acid ester having a structure represented by Formula 1 or 2; and a polymerizable monomer selected from the second (meth)acrylic acid ester, an olefin-based compound and a mixture thereof, each of which contains a functional group selected from the group consisting of a hydroxyl group, a carboxyl group, a lactone group, a nitro group and a halogen group, using a general polymerization method such as bulk polymerization, solution polymerization, suspension polymerization, bulk-suspension polymerization, or emulsion polymerization.

Preferably, the hydrophilic photoacid generator according to the present invention may be polymerized by radical polymerization and, in this case, any radical polymerization initiator may be used without particular limitation so long as it is generally used as a radical polymerization initiator such as azobisisobutyronitrile (AIBN), benzoyl peroxide (BPO), lauryl peroxide, azobisisocapronitrile, azobisisovaleronitrile, or t-butyl hydroperoxide.

Also, a polymerization solvent is selected from benzene, toluene, xylene, halogenated benzene, diethyl ether, tetrahydrofuran, esters, ethers, lactones, ketones, amides, alcohols and a combination thereof.

Also, during polymerization, the first (meth)acrylic acid ester and the polymerizable monomer are preferably used at a weight ratio of 1:99 to 99:1.

During polymerization, a polymerization temperature is determined depending on the type of catalysts. Also, a molecular weight distribution of prepared polymer may be suitably controlled by changing an amount of used polymerization initiator and reaction time. After polymerization, unreacted monomer remaining in the reaction mixture and by-products are preferably removed by precipitation using a solvent.

The hydrophilic photoacid generator according to the present invention obtained by controlling the type and content of monomer in accordance with the method contains a hydrophilic group at the end of a side chain, thus exhibiting a resist level of contact angle and being uniformly distributed in the resist film.

Specifically, the hydrophilic photoacid generator according to the present invention may be a block copolymer, a random copolymer or a graft copolymer having a structure of Formula 13 or 14 below.

[Formula 13]

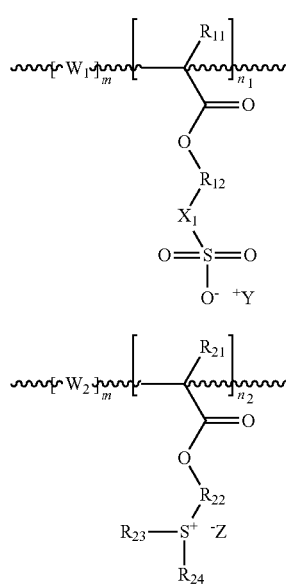

[Formula 14]

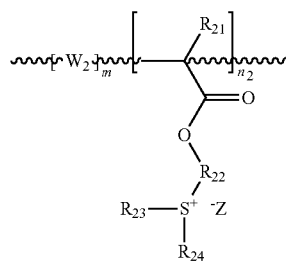

Formulae 13 and 14, $W_1$ and $W_2$ are each independently derived from a compound selected from the group consisting of a second (meth)acrylic acid ester, an olefin-based compound and a mixture thereof, each of which contains a functional group selected from the group consisting of a hydroxyl group, a carboxyl group, a lactone group, a nitrile group and a halogen group;

$R_{11}$, $R_{12}$, $R_{21}$ to $R_{24}$, $X_1$, $Y^+$ and $Z^-$ are defined as above;

m, $n_1$ and $n_2$ are numbers of repeat units present in a main chain, satisfy $0<m/(m+n_1)<0.99$ and $0<n_1/(m+n_1)\leq0.99$ with the proviso of $m+n_1=1$, and satisfy $0<m/(m+n_2)<0.99$ and $0<n_2/(m+n_2)\leq0.99$ with the proviso of $m+n_2=1$.

Specific examples of the hydrophilic photoacid generator according to the present invention include compounds having structures represented by the following Formulae 15 to 23, and an order of repeat units in the Formulae may be changed:

[Formula 15]

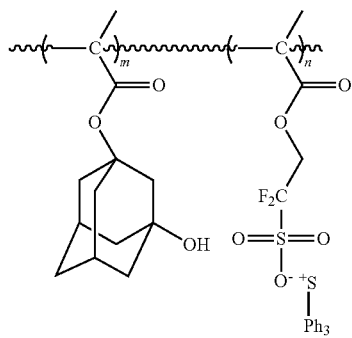

[Formula 16]

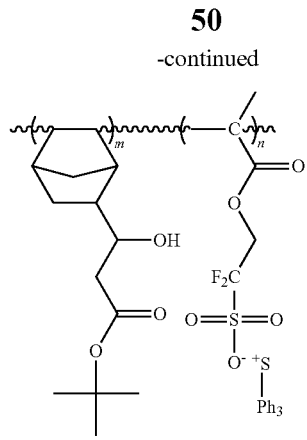

[Formula 17]

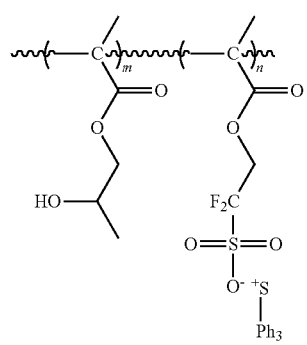

[Formula 18]

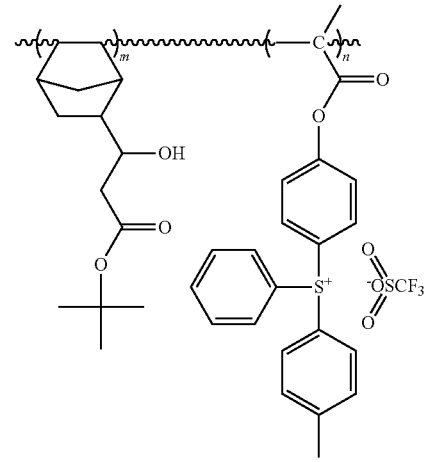

[Formula 19]

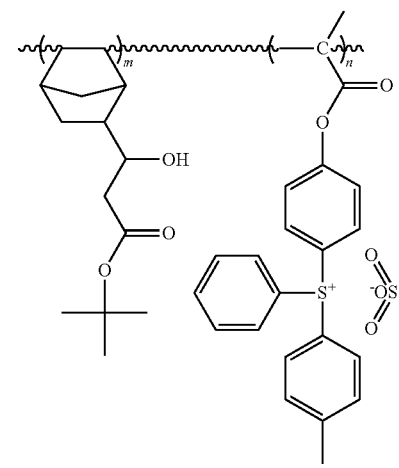

[Formula 20]

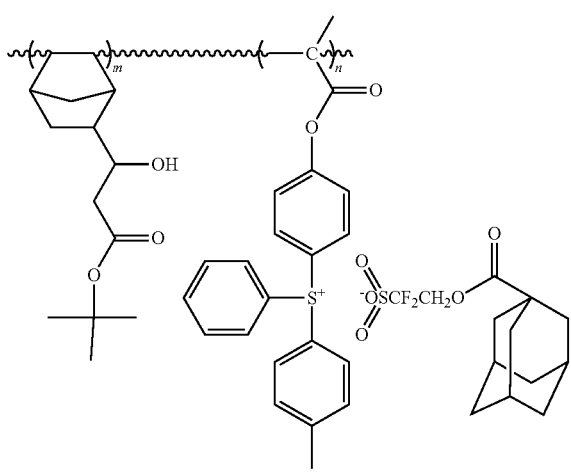

[Formula 21]

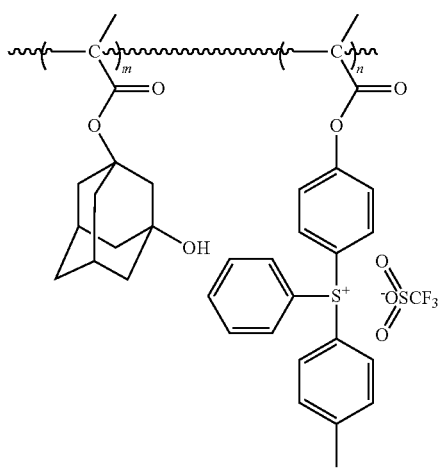

[Formula 22]

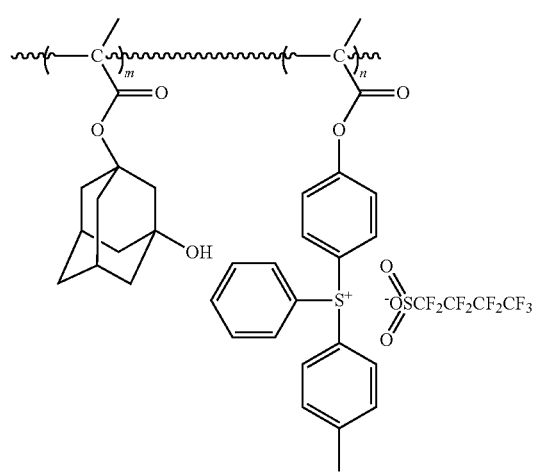

[Formula 23]

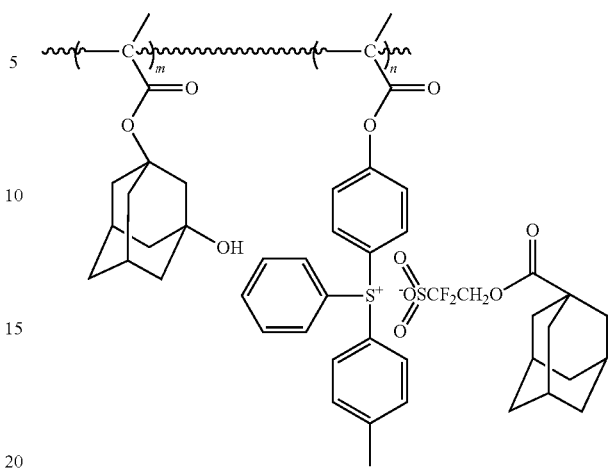

In Formulae 15 to 23, ph represents a phenyl group, and m and n are numbers of repeat units present in the main chain, and satisfy m+n=1, 0<m/(m+n)≤0.99 and 0<n/(m+n)≤0.99.

The hydrophilic photoacid generator has a weight average molecular weight (hereinafter, referred to as "Mw") in terms of polystyrene measured by gel permeation chromatography (GPC), of 1,000 to 500,000 g/mol. When the weight average molecular weight of the hydrophilic photoacid generator is excessively large, solubility may be deteriorated. Preferably, the weight average molecular weight is 2,000 to 100,000 g/mol in consideration of miscibility with a main resin.

Also, the hydrophilic photoacid generator preferably has a molecular weight distribution, which is a ratio (Mw/Mn) of a weight average molecular weight to a number average molecular weight, of 1 to 5, more preferably 1 to 3. Also, when the molecular weight distribution of the hydrophilic photoacid generator exceeds 5, line edge roughness may be poor. Accordingly, when the hydrophilic photoacid generator satisfying the defined ranges of weight average molecular weight and molecular weight distribution is applied to a photoresist composition, the photoresist composition is uniformly distributed in the resist film, thus improving characteristics such as line edge roughness of the resist pattern.

In another aspect of the present invention, provided is a resist composition comprising the hydrophilic photoacid generator.

Specifically, the resist composition comprises the hydrophilic photoacid generator, a base copolymer and a solvent.

The hydrophilic photoacid generator has been described above and may be used alone or in combination of two or more thereof. Also, the photoacid generator may be present in an amount of 0.3 to 15 parts by weight, preferably 0.5 to 10 parts by weight, and more preferably 2 to 10 parts by weight, based on 100 parts by weight of polymer solid content. When the content of the photoacid generator exceeds 15 parts by weight, verticality of patterns may be considerably deteriorated, and when the content of the photoacid generator is lower than 0.3 parts by weight, pattern flexibility may be deteriorated.

Any base copolymer for resists may be used without particular limitation so long as it is used as a base resin for formation of resist films. Specifically, for example, the base copolymer for resists may be selected from the group consisting of a (meth)acrylic acid ester polymer, a (α-trifluoromethyl)acrylic acid ester-anhydrous maleic acid copolymer, a cycloolefin-anhydrous maleic acid copolymer, polynorbornene, a polymer compound obtained by ring-opening metathesis of cycloolefin, a polymer compound obtained by addition of hydrogen to a polymer compound obtained by ring-opening metathesis of cycloolefin, a polymer compound obtained by copolymerization of hydroxystyrene with one of a (meth)acrylic acid ester derivative, styrene, vinyl naphthalene, vinylanthracene, vinylpyrene, hydroxyvinyl naphthalene, hydroxyvinyl anthracene, indene, hydroxyindene, acenaphthene and norbornadiene, a novolac resin and a mixture thereof.

The base copolymer may be present in an amount of 3 to 20% by weight, with respect to the total weight of the resist composition. When the content of the base copolymer is lower than 3% by weight, a film with a desired thickness cannot be formed due to excessively low viscosity of the composition and pattern loss may be serious due to a greater amount of photoacid generator. When the content of the base copolymer exceeds 20% by weight, radiolucency is deteriorated and it is disadvantageously difficult to obtain vertical patterns due to excessively great film thickness.

In order to obtain a uniform and even resist-applied film, the copolymer and the hydrophilic photoacid generator are dissolved in a solvent having a suitable evaporation speed and viscosity before use. Examples of the solvent that can be used in the present invention include esters such as ethylene glycol monomethyl ether, ethylene glycol monoethyl ether, ethylene glycol monopropyl ether, methylcellosolve acetate, ethylcellosolve acetate, propylene glycol monomethyl ether acetate, propylene glycol monoethyl ether acetate, and propylene glycol monopropyl ether acetate; and ketones such as methyl isopropyl ketone, cyclohexanone, methyl 2-hydroxypropionate, ethyl 2-hydroxypropionate, 2-heptanone, ethyl lactate and gamma-butyrolactone. The solvent may be used alone or in combination of two or more thereof.

An amount of the used solvent may be suitably controlled depending on physical properties of the solvent, that is, volatility and viscosity, so that a uniform resist film can be formed.

In addition, the resist composition according to the present invention may further comprise an additive according to purpose such as improvement of applicability (coatability).

Any additive may be used without particular limitation so long as it is commonly applied to resist compositions. Specific examples thereof include an alkali-dissolution inhibitor, an acid-diffusion inhibitor, a surfactant or the like. The additive may be used alone or in combination of two or more thereof.

Any alkali-dissolution inhibitor may be used so long as it is commonly applied to a resist composition and specific examples thereof include phenol or carboxylic acid derivatives.

The acid-diffusion inhibitor functions to control diffusion of an acid generated from the hydrophilic photoacid generator by irradiation into the resist film and to inhibit chemical reactions in an unexposed part. By using such an acid-diffusion inhibitor, storage stability of a radiation-sensitive resin composition can be improved, resolution of resist can be further improved, and variation in line widths of resist patterns caused by variation in post exposure delay (PED) which means a time taken from exposure to development can be inhibited.

Such an acid-diffusion inhibitor may be a basic compound and specific examples thereof include amines such as ammonia, methylamine, isopropylamine, n-hexylamine, cyclopentylamine, methylenediamine, ethylenediamine, dimethylamine, diisopropylamine, diethylenediamine, N,N-dimethylmethylenediamine, N,N-dimethylethylenediamine, trimethylamine, triethylamine, N,N,N',N'-tetramethylmethylenediamine, N,N,N',N'-tetramethylethylenediamine, N,N,N',N'-tetramethyltetraethylenepentamine, dimethylethylamine, methylethylpropylamine, benzylamine, phenethylamine, benzyldimethylamine, tetramethylammonium hydroxide, aniline, N,N-dimethyltoluidine triphenylamine, phenylenediamine, pyrrole, oxazole, isoxazole, thiazole, isothiazole, imidazole, pyrazole, pyrroline, pyrrolidine, imidazolidine derivatives, imidazolidine derivatives, pyridine derivatives, pyridazine derivatives, pyrimidine derivatives, pyrazine derivatives, pyrazoline derivatives, pyrazolidine derivatives, piperidine derivatives, piperazine derivatives and morpholine; nitrogen-containing compounds such as aminobenzoic acid, indole carboxylic acid, amino acid derivatives (for example nicotinic acid, alanine, arginine, and asparaginic acid), 3-pyridinesulfonic acid, pyridinium p-toluenesulfate, 2-hydroxypyridine, aminocresol, 2,4-quinolinediol, 2-(2-hydroxyethyl)pyridine, or 1-(2-hydroxyethyl)piperazine; amide derivatives such as formamide, N-methylformamide, N,N-dimethylformamide, acetamide, N-methylacetamide, N,N-dimethylacetamide, propionamide and benzamide; and imide derivatives such as phthalimide, succinimide and maleimide.

The acid-diffusion inhibitor may be present in an amount of 0.01 to 5 parts by weight, preferably 0.1 to 1 parts by weight, with respect to 100 parts by weight of the solid content of the polymer. When the content of the acid-diffusion inhibitor is lower than 0.01 parts by weight, an effect of the post exposure delay time is increased and pattern shapes may be affected, and when the content exceeds parts by weight, resolution and sensitivity may be deteriorated.

The surfactant improves properties such as applicability and development property and specific examples thereof include, but are not limited to, polyoxyethylene lauryl ether, polyoxyethylene stearyl ether, polyoxyethylene and polyethylene glycol dilaurate.

The resist composition having the composition as described according to the present invention comprises a highly hydrophilic copolymer as a hydrophilic photoacid generator, thereby exhibiting superior dispersibility in the resist film and, as a result, improving line edge roughness of resist patterns.

Hereinafter, examples of the present invention will be described in detail to an extent to which a person having ordinary knowledge in the technical field to which the present invention pertains can easily implement the invention. However, the present invention may be realized as various modifications and is not limited to examples described herein.

PREPARATION EXAMPLE

Synthesis of Monomer and Polymer

Synthetic Example 1 of Monomer

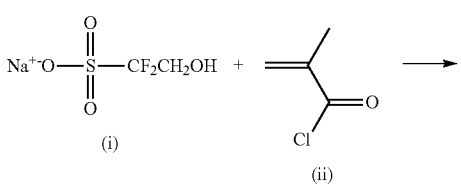

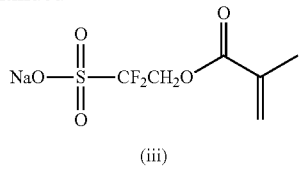

100 g (543 mmole) of sodium 1,1-fluoro-2-hydroxyethane sulfonate (i), 80 ml (815 mmole) of methacryloyl chloride (ii) and 0.5 g of Pentaerythritol Tetrakis(3-(3,5-di-tert-butyl-4-hydroxyphenyl)propionate) as a polymerization inhibitor were dissolved in 1,000 ml of dichloromethane, followed by stirring at 0° C. 114 ml (815 mmole) of triethylamine was slowly added to the resulting mixed solution using a dropping funnel, followed by stirring at 0° C. for 6 hours. After the reaction was completed, the solvent present in the resulting reaction mixture was removed under reduced pressure while a bath temperature was maintained at 25° C., the resulting solid was completely dissolved in 500 ml of distilled water, and 300 g of potassium carbonate was slowly added thereto in a bath at 0° C., followed by recrystallization. The resulting product was diluted with diethyl ether and was then filtered through a Büchner funnel. The resulting solid was washed with tetrahydrofuran to remove impurities and thereby obtain 130 g of a target compound (iii) as a white solid (yield: 95%).

$^1$H-NMR (DMSO, internal standard: tetramethylsilane): (ppm) 1.91 (s, 3H), 4.57~4.67 (t, 2H), 5.77 (s, 1H), 6.11 (s, 1H)

Synthetic Example 2 of Monomer

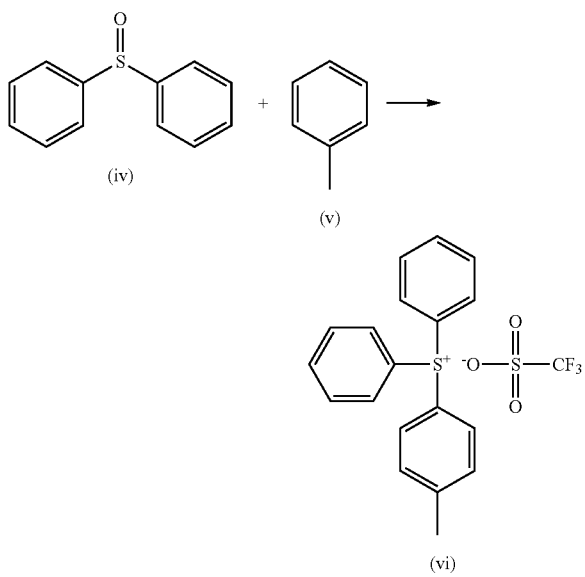

100 g (494 mmole) of diphenyl sulfoxide (iv) and 52 ml (494 mmole) of toluene (v) were dissolved in 1,000 ml of dichloromethane, followed by stirring at −50° C. 92 ml (543 mmole) of trifluoromethanesulfonic acid anhydride (triflic anhydride) was slowly added to the resulting mixed solution using a dropping funnel, followed by stirring at −50° C. for 6 hours. After the reaction was completed, the resulting reaction mixture was slowly added to an aqueous potassium carbonate solution (100 g of potassium carbonate in 1,000 ml of distilled water) and then neutralized therewith. After this process was repeated once, the resulting reaction product was extracted in 500 ml of dichloromethane and washed with 1,000 ml of distilled water. The solvent present in the resulting reaction product was removed under reduced pressure. The resulting solid was dissolved in 300 ml of dichloromethane and 300 ml of n-hexane was slowly added thereto, followed by recrystallization. The resulting solid was filtered through a Büchner funnel and the filtered solid was washed with diethyl ether to obtain 168 g of a target compound (vi) as a white solid (yield: 80%).

$^1$H-NMR (chloroform-d3, internal standard: tetramethylsilane): (ppm) 2.43 (s, 3H), 7.43~7.80 (m, 14H)

Synthetic Example 3 of Monomer

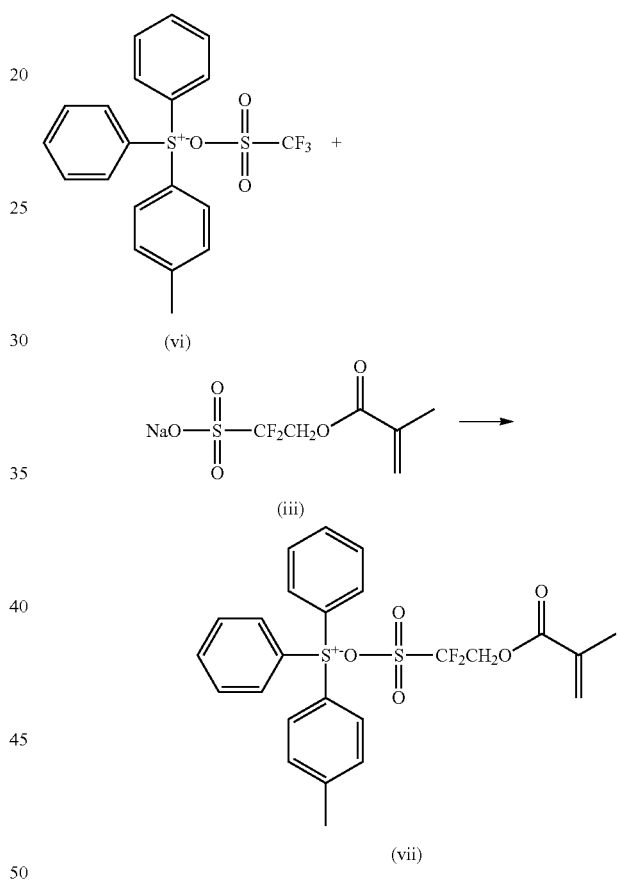

100 g (234 mmole) of the compound (vi) prepared in Synthetic Example 2, 177 g (703 mmole) of compound (iii) prepared in Synthetic Example 1, and 0.5 g of Pentaerythritol Tetrakis(3-(3,5-di-tert-butyl-4-hydroxyphenyl)propionate) were dissolved in 3,000 ml of dichloromethane to prepare a mixed solution and the mixed solution was stirred at room temperature for 8 hours. After the reaction was completed, the resulting reaction solution was extracted in 1,000 ml of dichloromethane and washed with distilled water. After this process was repeated twice, the solvent was removed under reduced pressure. The resulting solid was dissolved in 400 ml of a mixture (weight ratio 3:1) of tetrahydrofuran and dichloromethane and was then re-crystallized in n-hexane. The resulting solid was filtered through a Büchner funnel and was then washed with diethyl ether to obtain 84 g of a target compound (vii) as a white solid (yield: 71%).

$^1$H-NMR (chloroform-d3, internal standard: tetramethylsilane): (ppm) 1.95 (s, 3H), 2.43 (s, 3H), 4.82 (t, 2H), 5.60 (s, 1H), 6.22 (s, 1H), 7.43~7.80 (m, 14H)

Synthetic Example 4 of Monomer

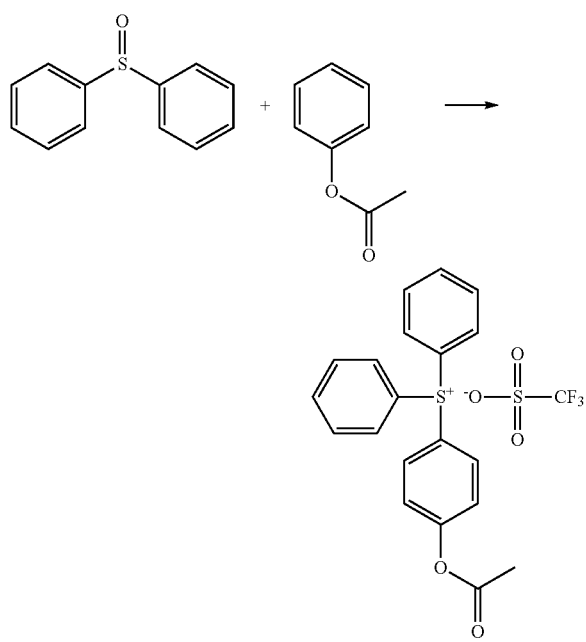

100 g (494 mmole) of diphenyl sulfoxide (iv) and 62 ml (494 mmole) of phenylacetate (viii) were dissolved in 1,000 ml of dichloromethane, followed by stirring at −50° C. 92 ml (543 mmole) of trifluoromethanesulfonic acid anhydride (triflic anhydride) was slowly added to the resulting mixed solution using a dropping funnel, followed by stirring at −50° C. for 6 hours. After the reaction was completed, the resulting reaction mixture was slowly added to an aqueous potassium carbonate solution (100 g of potassium carbonate in 1,000 ml of distilled water) and neutralized therewith. After this process was repeated once, the resulting reaction product was extracted in 500 ml of dichloromethane and washed with 1,000 ml of distilled water. The solvent present in the resulting reaction product was removed under reduced pressure. The resulting solid was dissolved in 300 ml of dichloromethane and 300 ml of n-hexane was slowly added thereto, followed by recrystallization. The resulting solid was filtered through a Büchner funnel, and the filtered solid was washed with diethyl ether to obtain 162 g of a target compound (vi) as a white solid (yield: 70%).

$^1$H-NMR (chloroform-d3, internal standard: tetramethylsilane): (ppm) 2.33 (s, 3H), 6.96~7.84 (m, 14H)

Synthetic Example 5 of Monomer

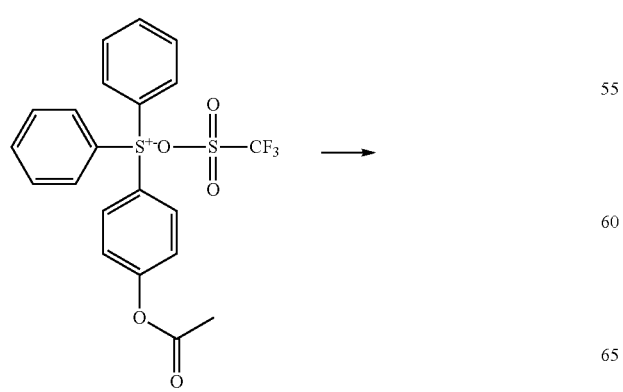

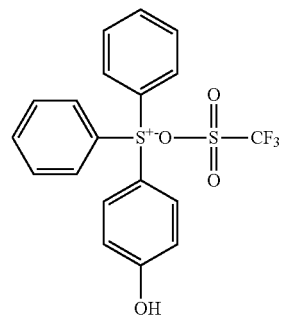

100 g (212 mmole) of (4-acetoxyphenyl)diphenylsulfonium trifluoromethylsulfonate and 8.1 g (43 mmole) of p-toluenesulfonic acid were dissolved in 1,000 ml of methanol, followed by stirring at −80° C. for 12 hours. After the reaction was completed, the solvent was removed under reduced pressure, extracted in 500 ml of ethyl acetate, and washed with 1N—HCl and 1,000 ml of distilled water. The solvent was removed from the resulting reaction product under reduced pressure to obtain 77 g of a target compound (x) as a yellow solid (yield: 85%).

$^1$H-NMR (chloroform-d3, internal standard: tetramethylsilane): (ppm) 7.14~7.75 (m, 14H)

Synthetic Example 1 of Polymer

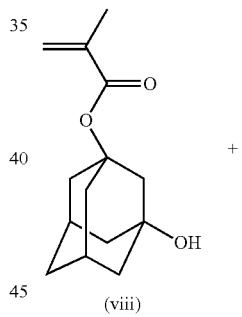

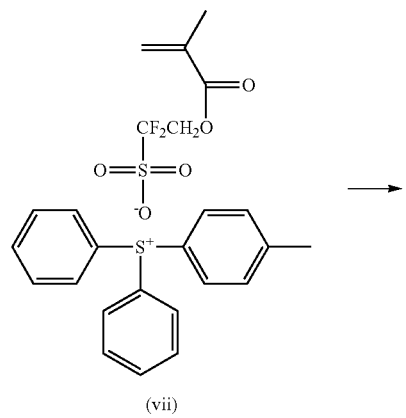

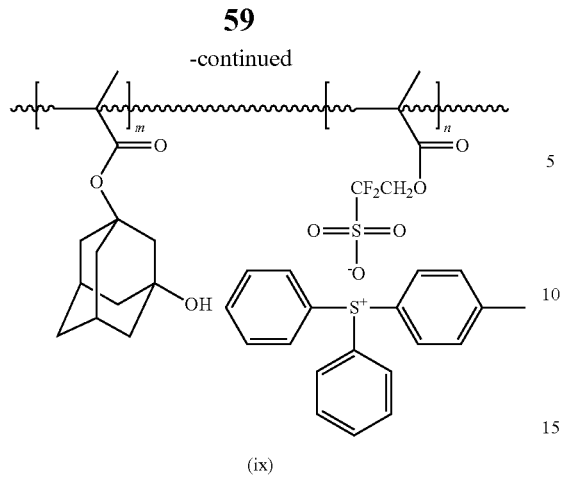

(ix)

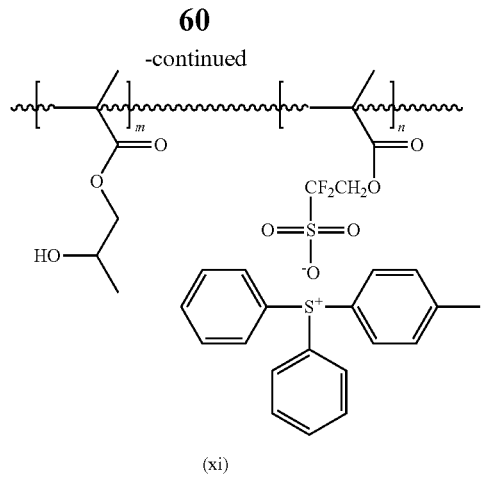

(xi)

10 g (35.7 mmole) of a polymerizable monomer (viii), 19.6 g (35.7 mmole) of the polymerizable monomer (vii) prepared in Synthetic Example 3 of Monomer, 0.5 g of dimethyl azobisisobutyrate as a polymerization initiator were dissolved in 10 g of 1,4-dioxane in a flask. The air in the flask was purged with nitrogen gas, an inner temperature of the flask was elevated to 75° C. and reaction was proceeded at this temperature for 3 hours. After the reaction was completed, the resulting reaction solution was cooled to room temperature, was precipitated using an excess normal-hexane and the resulting precipitate was filtered. The resulting filtrate was washed with the same solvent and dried under reduced pressure to obtain 15 g of a polymer (xi). The weight average molecular weight (Mw) of the polymer in terms of polystyrene was 1,500 g/mol, and a ratio of weight average molecular weight to number average molecular weight (Mw/Mn) thereof was 1.53.

Synthetic Example 2 of Polymer

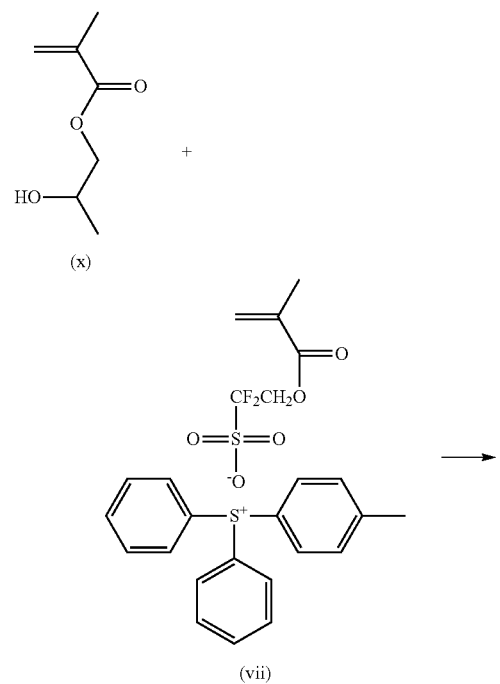

10 g (57.4 mmole) of a polymerizable monomer (xii), 31.6 g (35.7 mmole) of the monomer (vii) prepared in Synthetic Example 3 of Monomer, and 0.5 g of dimethyl azobisisobutyrate as a polymerization initiator were dissolved in 10 g of 1,4-dioxane in a flask. The air in the flask was purged with nitrogen gas, an inner temperature of the flask was elevated to 75° C. and reaction was proceeded at this temperature for 3 hours. After the reaction was completed, the resulting reaction solution was cooled to room temperature, was precipitated using an excess of n-hexane and the resulting precipitate was filtered. The resulting filtrate was washed with the same solvent and dried under reduced pressure to obtain 17 g of a polymer (xiii). The weight average molecular weight (Mw) of this polymer in terms of polystyrene was 1,650 g/mol, and a ratio of weight average molecular weight to number average molecular weight (Mw/Mn) thereof was 1.53.

Synthetic Example 3 of Polymer

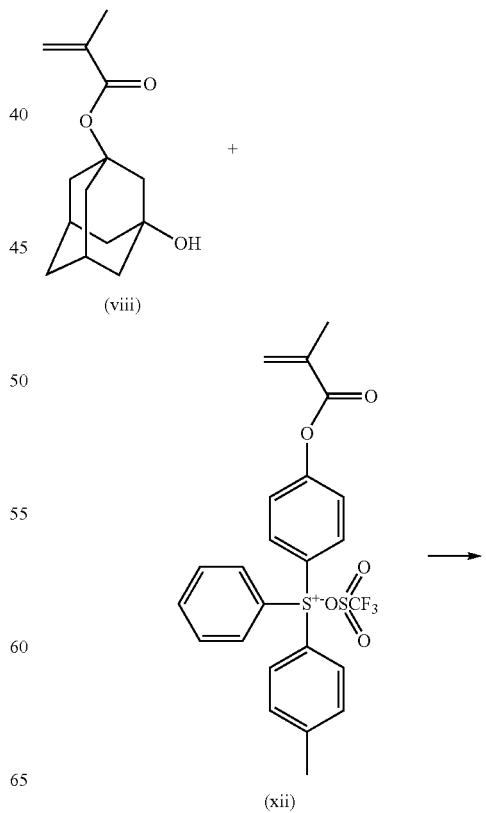

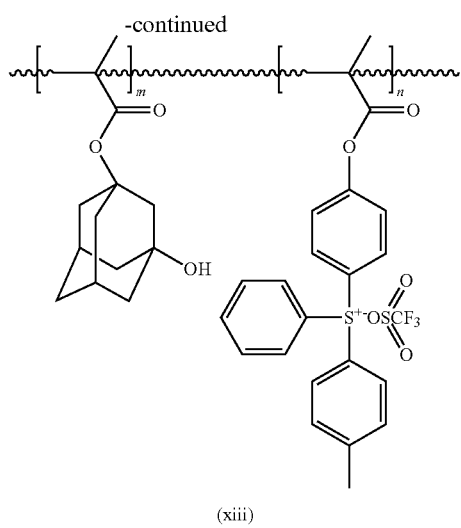

(xiii)

10 g (35.7 mmole) of a polymerizable monomer (xiii), 19.8 g (35.7 mmole) of a monomer (xiv), and 0.5 g of dimethyl azobisisobutyrate as a polymerization initiator were dissolved in 10 g of 1,4-dioxane in a flask. The air in the flask was purged with nitrogen gas, an inner temperature of the flask was elevated to 75° C. and reaction was proceeded at this temperature for 3 hours. After the reaction was completed, the resulting reaction solution was cooled to room temperature, was precipitated using excess normal-hexane and the resulting precipitate was filtered. The resulting filtrate was washed with the same solvent and dried under reduced pressure to obtain 15 g of a polymer (xv). The weight average molecular weight (Mw) of this polymer in terms of polystyrene was 1,600 g/mol, and a ratio of weight average molecular weight to number average molecular weight (Mw/Mn) thereof was 1.53.

TEST EXAMPLE

Resist patterns were formed using the hydrophilic photoacid generators prepared in Synthetic Examples 1 to 3 of Polymer and the formed resist patterns were subjected to various tests.

Specifically, 100 parts by weight of a compound represented by Formula 24 below as a base resin (Mw: 8,500 g/mol, Mw/Mn: 1.75, molar ratio between respective repeat units is 1:1:1:1), 4 parts by weight of each of the compounds prepared in Synthetic Examples 1 to 3 of Polymer as photoacid generators, and 0.5 parts by weight of tetramethylammonium hydroxide as a basic additive were dissolved in 1,000 parts by weight of propylene glycol methyl ether acetate, followed by filtration through a 0.2 um membrane filter to prepare a resist composition. For comparison of effects, a resist composition was prepared in the same manner as above, except that the photoacid generator represented by Formula 25 below was used, which is referred to as "Comparative Example 1".

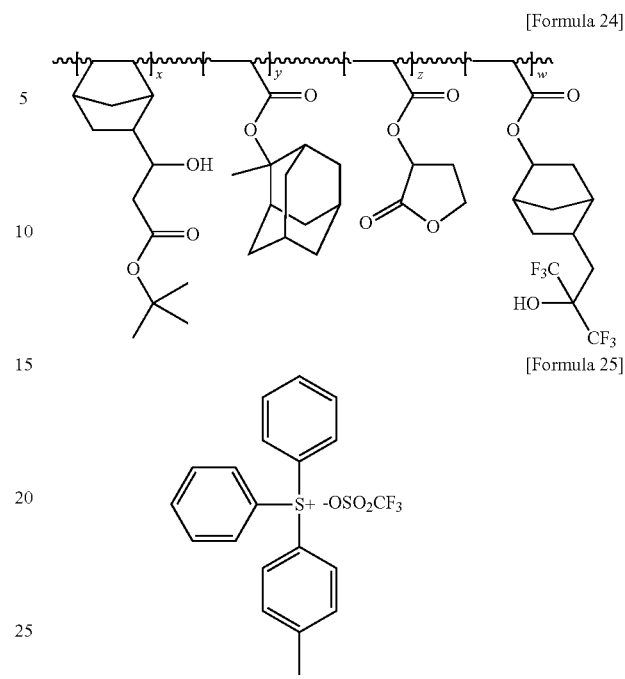

[Formula 24]

[Formula 25]

The resulting resist composition was applied to a substrate using a spinner and then dried at 110° C. for 90 seconds to form a thin film with a thickness of 0.20 μm. The formed thin film was exposed to an ArF excimer laser stepper (lens aperture number: 0.78) and was then thermally treated at 110° C. for 90 seconds. Subsequently, the film was developed using a 2.38 wt % aqueous tetramethylammonium hydroxide solution for 40 seconds, washed and dried to form a resist pattern.

The formed resist pattern was subjected to various tests and the results thus obtained are shown in Table 1 below.

In Table 1 below, sensitivity was defined as an optimal exposure dose which is an exposure dose enabling formation of a 0.10 um line and space (L/S) pattern at a line width of 1:1 after development, and the developed minimal pattern size was defined as a resolution.

In addition, regarding LER (line edge roughness), roughness was observed for the 0.10 um line and space (L/S) pattern formed after development and LER was measured (as value of LER decreases, an LER property becomes better).

TABLE 1

| | Photoacid generator | Sensitivity (mJ/cm²) | Resolution (nm) | LER |
|---|---|---|---|---|
| Ex. 1 | Synthetic Example 1 of Polymer (xi) | 45 | 70 | 3.0 nm |
| Ex. 2 | Synthetic Example 2 of Polymer (xiii) | 40 | 65 | 2.5 nm |
| Ex. 3 | Synthetic Example 3 of Polymer (xv) | 15 | 75 | 3.2 nm |
| Comp. Ex. 1 | Compound of Formula 25 | 20 | 70 | 5.2 nm |

It can be seen that the resist compositions prepared in Examples 1 to 3 exhibited superior development property to an aqueous tetramethylammonium hydroxide solution and excellent adhesion of formed resist patterns to substrates, as compared to the resist composition prepared in Comparative Example 1. From the results shown in Table 1, it can be seen that the resist compositions prepared in Examples 1 to 3 exhibited superior sensitivity, resolution and LER properties, as compared to the resist composition prepared in Comparative Example 1.

As apparent from the fore-going, the hydrophilic photoacid generator is uniformly dispersed in a resist film, thus improving characteristics, such as line edge roughness of resist patterns.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A resist composition comprising a hydrophilic photoacid generator, a base copolymer and a solvent, wherein the photoacid generator is selected from the group consisting of compounds represented by Formulae 15 to 23:

[Formula 15]

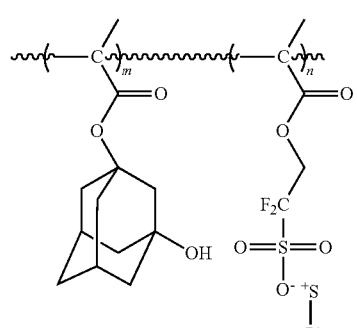

[Formula 16]

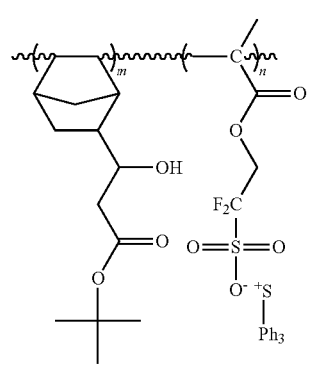

[Formula 17]

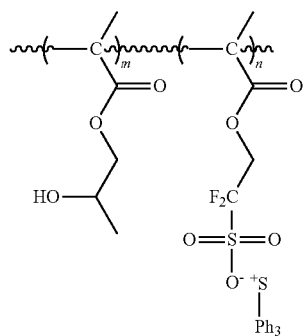

[Formula 18]

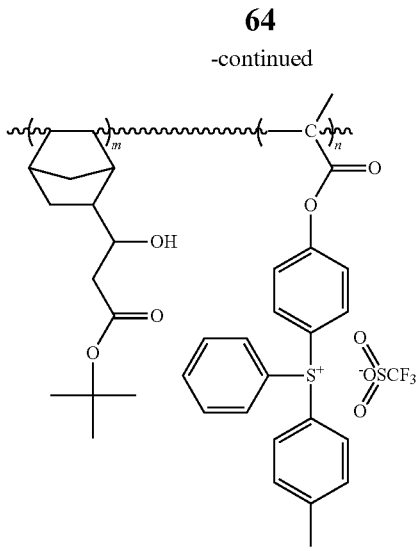

[Formula 19]

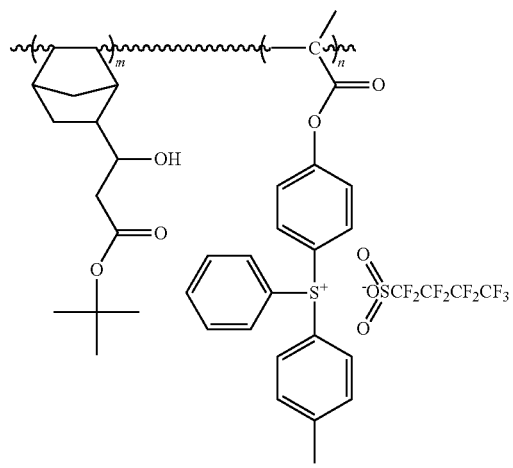

[Formula 20]

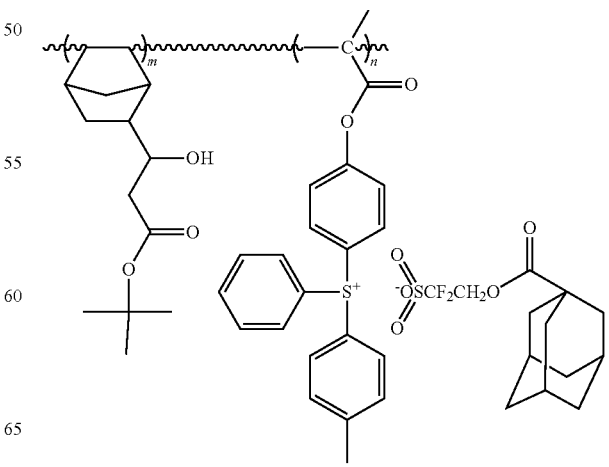

[Formula 21]

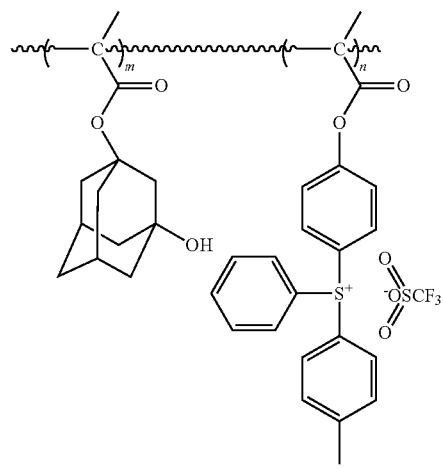

[Formula 22]

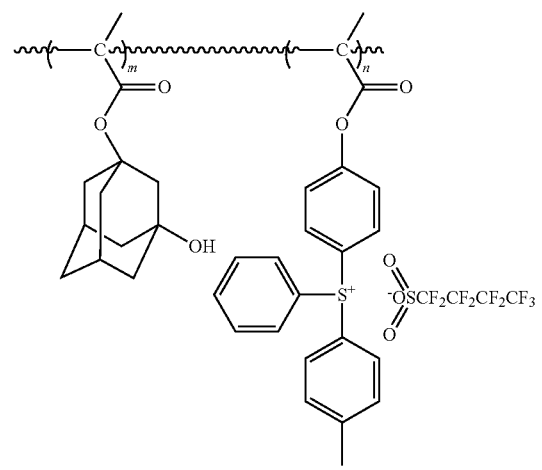

[Formula 23]

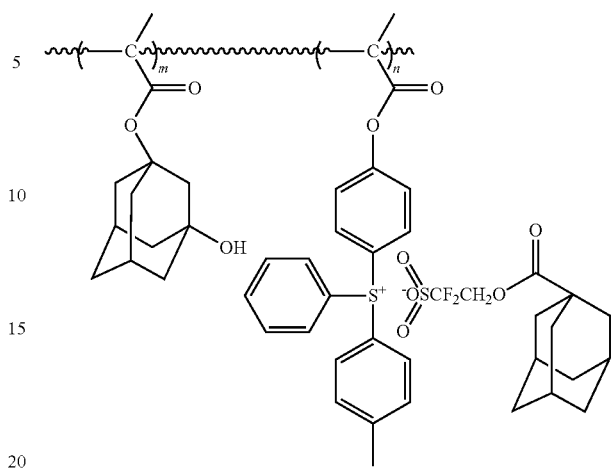

wherein, in Formulae 15 to 23, ph represents a phenyl group, and m and n are numbers of repeat units present in the main chain and satisfy m+n=1, o<m/(m+n)≤0.99 and 0<n/(m+n)≤0.99.

2. The resist composition according to claim 1, wherein the hydrophilic photoacid generator has a weight average molecular weight in terms of polystyrene measured by gel permeation chromatography (GPC) of 1,000 to 500,000 g/mol.

3. The resist composition according to claim 1, wherein the hydrophilic photoacid generator has a ratio of weight average molecular weight to number average molecular weight of 1 to 5.

4. The resist composition according to claim 1, wherein the hydrophilic photoacid generator is present in an amount of 0.3 to 10 parts by weight, with respect to 100 parts by weight of a solid content of the resist composition.

* * * * *